(12) United States Patent
You et al.

(10) Patent No.: US 10,854,623 B2
(45) Date of Patent: Dec. 1, 2020

(54) MEMORY DEVICE

(71) Applicant: SAMSUNG ELECTRONICS CO., LTD., Suwon-si (KR)

(72) Inventors: Jang Hyun You, Seoul (KR); Jin Taek Park, Suwon-si (KR); Taek Soo Shin, Seoul (KR); Sung Yun Lee, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/509,708

(22) Filed: Jul. 12, 2019

(65) Prior Publication Data
US 2019/0341396 A1 Nov. 7, 2019

Related U.S. Application Data

(63) Continuation of application No. 15/295,119, filed on Oct. 17, 2016, now Pat. No. 10,355,010.

(30) Foreign Application Priority Data

Jan. 18, 2016 (KR) .................. 10-2016-0005963

(51) Int. Cl.
*H01L 27/11568* (2017.01)
*H01L 27/1157* (2017.01)
(Continued)

(52) U.S. Cl.
CPC .... *H01L 27/11568* (2013.01); *H01L 27/1157* (2013.01); *H01L 27/11521* (2013.01);
(Continued)

(58) Field of Classification Search
None
See application file for complete search history.

(56) References Cited

U.S. PATENT DOCUMENTS 7,095,074 B2   8/2006 Tsukamoto et al.
8,213,231 B2   7/2012 Park et al.
(Continued)

FOREIGN PATENT DOCUMENTS

CN      102306655 A      1/2012
JP      2015-095596 A    5/2015

OTHER PUBLICATIONS

Chinese Office action and Search Report dated Mar. 18, 2020 for corresponding application CN 201710037082.0.

*Primary Examiner* — Moazzam Hossain
*Assistant Examiner* — Stanetta D Isaac
(74) *Attorney, Agent, or Firm* — Lee IP Law, P.C.

(57) ABSTRACT

A memory device including a substrate, a plurality of channel columns, a gate stack, an interlayer insulating layer, a plurality of first trenches, and at least one second trench. The substrate includes a cell array region and a connection region. The channel columns cross an upper surface of the substrate in the cell array region. The gate stack includes a plurality of gate electrode layers surrounding the channel columns in the cell array region. The gate electrode layers extend to different lengths in the connection region to form a stepped structure. The interlayer insulating layer is on the gate stack. The first trenches divide the gate stack and the interlayer insulating layer into a plurality of regions. The at least one second trench is inside of the interlayer insulating layer in the connection region and between the first trenches.

20 Claims, 27 Drawing Sheets

(51) Int. Cl.
*H01L 27/11575* (2017.01)
*H01L 27/11565* (2017.01)
*H01L 27/11521* (2017.01)
*H01L 27/11556* (2017.01)
*H01L 27/11582* (2017.01)
*H01L 29/788* (2006.01)
*H01L 29/792* (2006.01)

(52) U.S. Cl.
CPC .. *H01L 27/11556* (2013.01); *H01L 27/11565* (2013.01); *H01L 27/11575* (2013.01); *H01L 27/11582* (2013.01); *H01L 29/788* (2013.01); *H01L 29/792* (2013.01)

(56) References Cited

U.S. PATENT DOCUMENTS

| | | |
|---|---|---|
| 8,482,138 B2 | 7/2013 | Hwang et al. |
| 8,659,944 B2 | 2/2014 | Hung et al. |
| 8,760,928 B2 | 6/2014 | Chen et al. |
| 8,969,162 B2 | 3/2015 | Hwang et al. |
| 9,202,593 B1 | 12/2015 | Magia et al. |
| 9,224,502 B1 | 12/2015 | Sabde et al. |
| 9,893,074 B2 | 2/2018 | Lee et al. |
| 2012/0098139 A1 | 4/2012 | Chae et al. |
| 2013/0207067 A1 | 8/2013 | Pan et al. |
| 2014/0192594 A1 | 7/2014 | Lue |
| 2014/0334230 A1 | 11/2014 | Kwon |
| 2015/0179660 A1* | 6/2015 | Yada ................ H01L 21/02164 257/321 |

* cited by examiner

MEMORY DEVICE

CROSS-REFERENCE TO RELATED APPLICATIONS

This is a continuation application based on pending application Ser. No. 15/295,119, filed Oct. 17, 2016, the entire contents of which is hereby incorporated by reference.

Korean Patent Application No. 10-2016-0005963, filed on Jan. 18, 2016, and entitled, "Memory Device," is incorporated by reference herein in its entirety.

BACKGROUND

1. Field

One or more embodiments described herein relate to a memory device.

2. Description of the Related Art

Efforts to increase the integration of memory devices continue to be made. One type of memory device with improved integration is a vertical-type memory device. In this this type of memory device, memory cells having a vertical transistor structure are arranged in a stacked configuration.

SUMMARY

In accordance with one or more embodiments, a memory device includes a substrate including a cell array region adjacent to a connection region; a plurality of channel columns crossing an upper surface of the substrate in the cell array region; a gate stack including a plurality of gate electrode layers on the substrate and surrounding the channel columns in the cell array region, the gate electrode layers extending by different lengths in the connection region to form a stepped structure; an interlayer insulating layer on the gate stack; a plurality of first trenches to divide the gate stack and the interlayer insulating layer into a plurality of regions; and at least one second trench in the interlayer insulating layer in the connection region and between the first trenches.

In accordance with one or more other embodiments, a memory device includes a cell array region including a plurality of channel columns extending in a direction crossing an upper surface of a substrate and a plurality of gate electrode layers stacked on the substrate adjacent to the channel columns; and a connection region adjacent to the cell array region and including: a plurality of contact plugs connected to the gate electrode layers that extend in different lengths, and at least one dummy pattern part between the contact plugs.

In accordance with one or more other embodiments, a memory device includes a plurality of channel columns extending in a direction crossing an upper surface of a substrate; a plurality of gate electrode layers stacked on the substrate to surround the channel columns; a plurality of contact plugs connected to the gate electrode layers; a plurality of first trenches crossing an upper surface of the substrate and dividing the gate electrode layers into a plurality of regions; and a second trench in at least one of the regions and disposed between the contact plugs.

In accordance with one or more other embodiments, a memory device includes a plurality of channel columns; a gate stack including a plurality of gate electrode layers arranged in a stepped structure adjacent to the channel columns; an interlayer insulating layer on the gate stack; a plurality of first trenches to divide the gate stack and the interlayer insulating layer into a plurality of regions; and at least one second trench in the interlayer insulating layer and between the first trenches, wherein the at least one second trench and the first trenches have different lengths.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
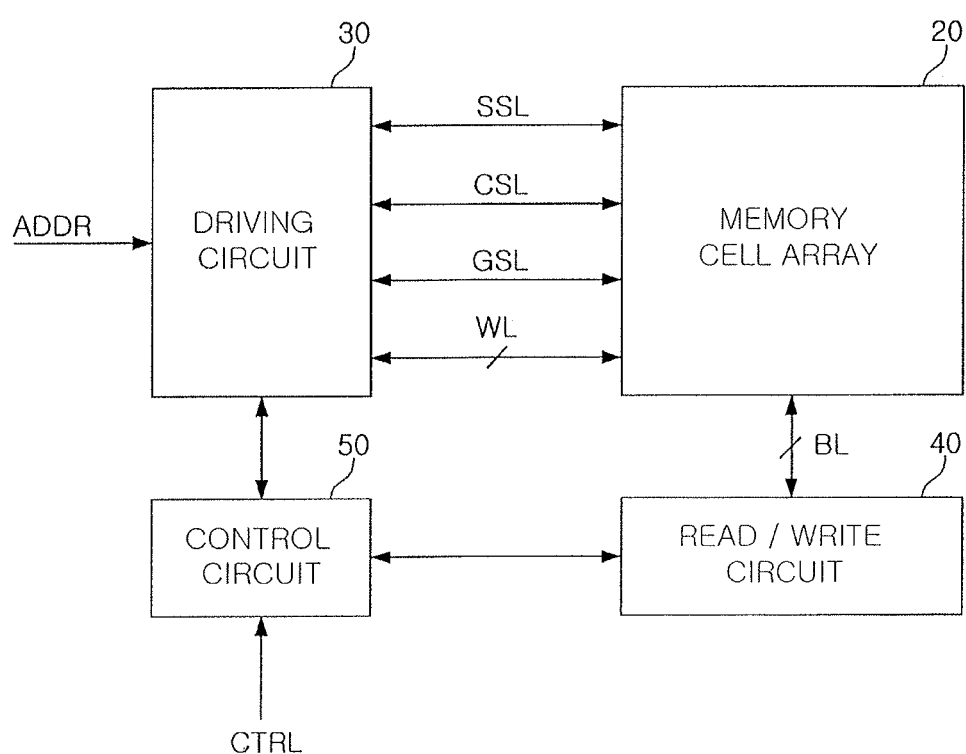
FIG. 1 illustrates an embodiment of a memory device.

FIG. 1 illustrates an embodiment of a memory device 10 which may include a memory cell array 20, a driving circuit 30, a read/write circuit 40, and a control circuit 50. The memory cell array 20 may include a plurality of memory cells arranged in a plurality of rows and columns. The memory cells may be connected to the driving circuit 30 through one or more word lines WL, a common source line CSL, a string select line SSL, a ground select line GSL, or the like, and may connected to a read/write circuit 40 through a bit line BL. In an example embodiment, memory cells in one row may be connected to one word line WL, and memory cells in one column may be connected to one bit line BL.

The memory cells in the memory cell array 20 may be divided into a plurality of memory blocks. Each memory block may include a plurality of word lines WL, a plurality of string select lines SSL, a plurality of ground select lines GSL, a plurality of bit lines BL, and at least one common source line CSL.

The driving circuit 30 and the read/write circuit 40 may be operated by the control circuit 50. In an example embodiment, the driving circuit 30 may receive externally supplied address information, decode the received address information, and select at least a portion of the word line WL, the common source line CSL, the string select line SSL, or the ground select line GSL connected to the memory cell array.

The driving circuit 30 may include a driving circuit for each of the word line WL, the string select line SSL, and the common source line CSL.

The read/write circuit 40 may select at least a portion of the bit lines BL connected to the memory cell array 20 according to a command from the control circuit 50. The read/write circuit 40 may read data stored in a memory cell connected to the selected at least a portion of the bit lines BL or may write data stored in a memory cell connected to the selected at least a portion of the bit lines BL. The read/write circuit 40 may include one or more circuits, e.g., a page buffer, an input/output buffer, a data latch.

The control circuit 50 may respond to a control signal CTRL from an external source, to thereby control operations of the driving circuit 30 and the read/write circuit 40. When data stored in the memory cell array 20 is read, the control circuit 50 may control operations of the driving circuit 30 to supply a voltage for reading operations to a word line WL in which data to be read is stored. When a voltage for reading operations is supplied to a specific word line WL, the control circuit 50 may control the read/write circuit 40 to read data stored in a memory cell connected to the word line WL that receives a voltage for reading operations.

When data is written to the memory cell array 20, the control circuit 50 may, for example, control operations of the driving circuit 30 to supply a voltage for writing operations to a word line WL, to which the data is to be written. When a voltage for writing operations is supplied to a specific word line WL, the control circuit 50 may control the read/write circuit 40 to record data to a memory cell connected to the word line WL, to which the voltage for writing operations is supplied.

Figure 2:
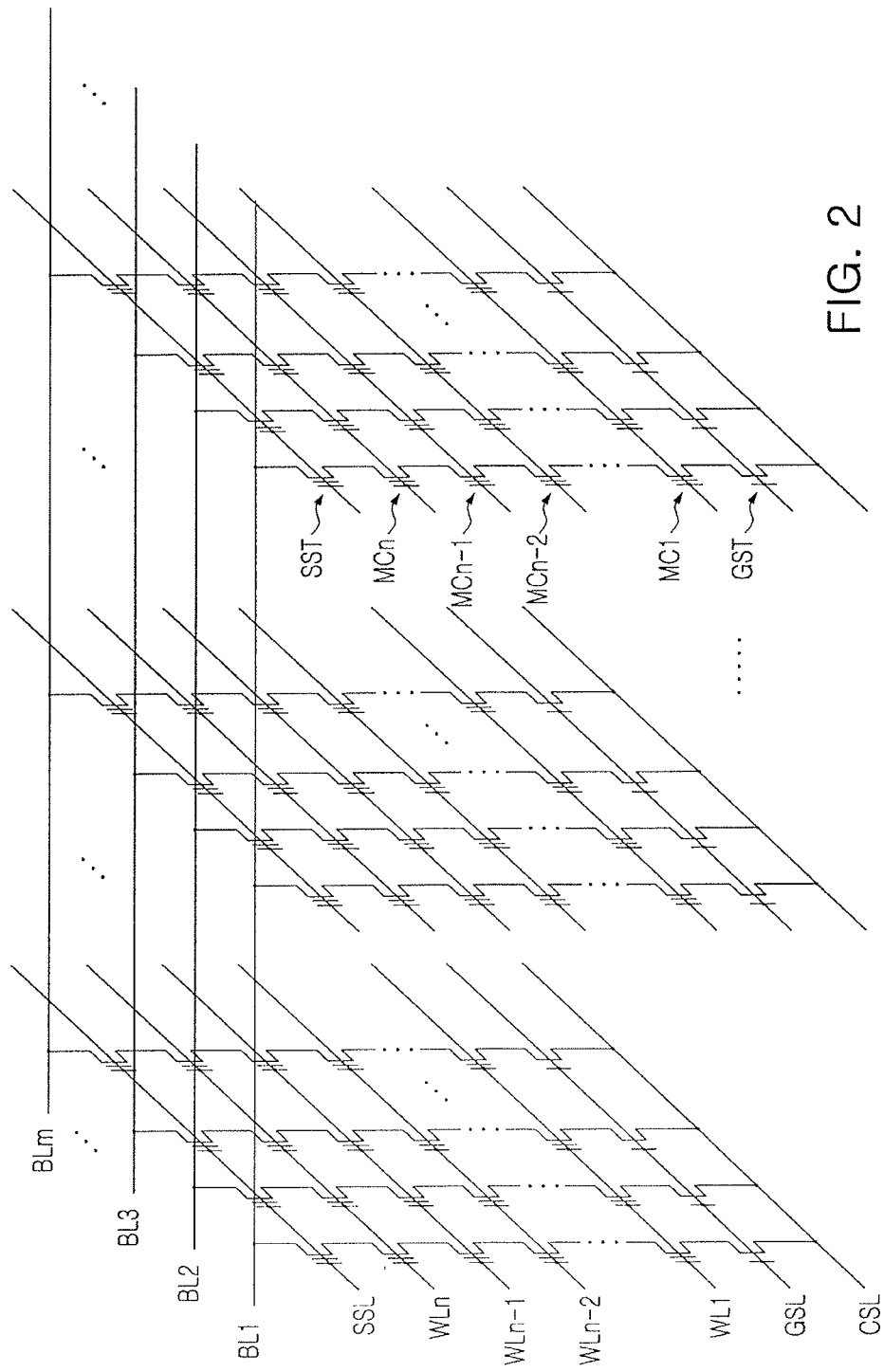
FIG. 2 illustrates a circuit embodiment of a memory cell array.

FIG. 2 illustrates an embodiment of an equivalent circuit diagram of a memory cell array of the memory device. The equivalent circuit diagram has a three-dimensional structure of a memory cell array.

Referring to FIG. 2, the memory cell array may include a plurality of memory cell strings, including N number of memory cell devices MC1 to MCn connected to each other in series and a ground selection transistor GST and a string select transistor SST connected to ends of the memory cell devices MC1 to MCn in series. The N number of memory cell devices MC1 to MCn connected to each other in series may be connected to word lines WL1 to WLn for selecting at least a portion of the memory cell devices MC1 to MCn, respectively.

The ground selection transistors GST may have gate terminals connected to a ground select line GSL and source terminals connected to a common source line CSL. The string select transistors SST may have gate terminals connected to a string select line SSL and source terminals connected to drain terminals of the memory cell devices MCn, respectively. FIG. 2 illustrates a structure in which one ground selection transistor GST and one string select transistor SST are connected to the N number of memory cell devices MC1 to MCn, which are connected to each other in series. In another embodiment, a plurality of ground selection transistors GST or a plurality of string select transistors SST may be connected to the N number of memory cell devices MC1 to MCn.

The string select transistors SST may have drain terminals connected to bit lines BL1 to BLm. For example, when a signal is applied to the gate terminals of the string select transistors SST through the string select line SSL, a signal applied through the bit lines BL1 to BLm is transmitted to the N number of memory cell devices MC1 to MCn connected to each other in series. Data reading or writing operations may therefore be executed.

Figure 3:
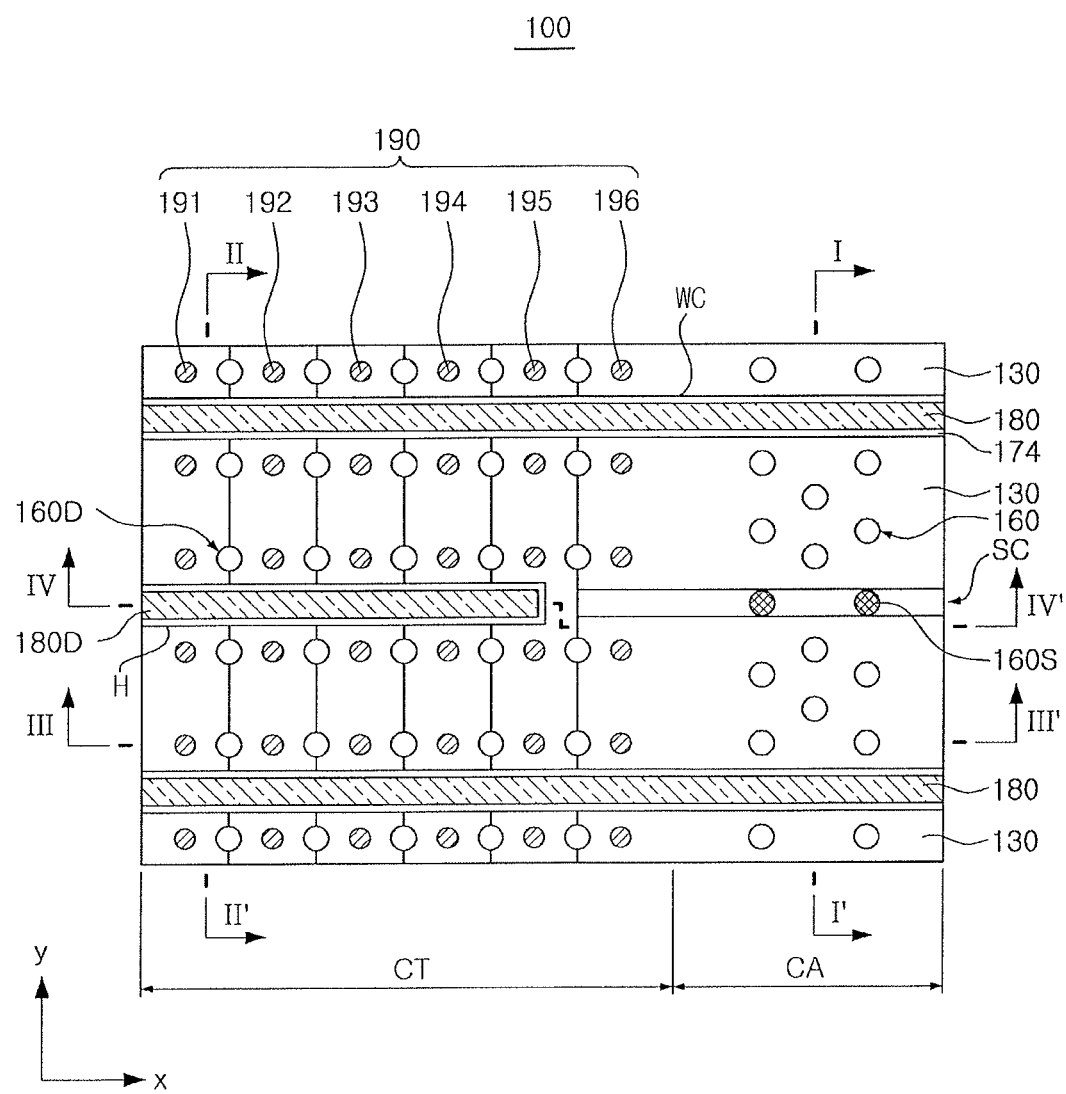
FIG. 3 illustrates an embodiment of a memory device.

FIG. 3 illustrates an embodiment of a memory device 100, and FIGS. 4A to 4D are cross-sectional views of the memory device 100 taken along lines I-I', II-II', III-III', and IV-IV' in FIG. 3, respectively. (An interlayer insulating layer 176 of the memory device 100 is illustrated, for example, in FIGS. 4A to 4D).

Referring to FIG. 3, the memory device 100 may include a cell array region CA and a connection region CT. The connection region CT may be in at least one end of the cell array region CA in a first direction, e.g., x-direction. In FIG. 3, only a portion of the cell array region CA is illustrated. In one embodiment, the connection region CT may be in both ends of the cell array region CA in an x-direction. The cell array region CA may correspond to the memory cell array 20 of FIG. 1, and the connection region CT may correspond to a region electrically connecting the memory cell array 20 and the driving circuit 30 of FIG. 1.

The memory device 100 may include gate stacks 130, channel columns 160, dummy columns 160D, dummy channel columns 160S, a common source line 180, a dummy source line 180D, and contact plugs 191 to 196 (contact plugs 190). The term "dummy" may refer to a configuration having a structure and shape identical or similar to other components, not practically functioning inside the memory device 100, and existing as a pattern. Thus, an electrical signal is not applied to a 'dummy' component, or the 'dummy' component does not perform an electrically specific function.

A gate stack including a plurality of gate electrode layers may be divided into a plurality of gate stacks 130 by common source lines 180. The gate stacks 130 may extend from the cell array region CA to the connection region CT in an x-direction, and may be spaced apart from each other by the common source lines 180 in a second direction, e.g., y direction. The common source lines 180 may extend throughout the entire cell array region CA and the entire connection region CT in the x-direction.

A third insulating layer 174 may be between the common source lines 180 and the gate stacks 130. The common source lines 180 and the gate stacks 130 may therefore be electrically insulated from each other. The gate stacks 130 may be divided into two separate regions by a dummy pattern part inside the connection region CT.

The dummy pattern part may include a dummy source line 180D and a third insulating layer 174 disposed on a lateral surface thereof. The dummy source lines 180D and the gate stacks 130 may be electrically insulated by the third insulating layer 174 from each other. The dummy source line 180D may be disposed, for example, along a virtual center line of the gate stack 130 extended in an x-direction. The dummy source line 180D may have a linear shape integrally extending from an edge of the connection region CT in a direction toward the cell array region CA, for example, in the x-direction. In an example embodiment, the dummy source line 180D may have a plurality of regions separated from each other in the x-direction.

In the example embodiment, one end of the dummy pattern part is illustrated as being inside the connection region CT. In another embodiment, one end of the dummy pattern part may further extend to the cell array region CA within a range, in which one end thereof is not in contact with channel columns 160 or dummy channel columns 160S inside the cell array region CA.

The common source line 180 and the dummy source line 180D may extend in an x-direction and may be parallel to each other. The common source line 180 may continuously extend in the cell array region CA and the connection region CT. The dummy source line 180D may only be in the connection region CT. For example, the common source line 180 and the dummy source line 180D may extend by different lengths in the x-direction. The dummy source lines 180D may extend to be shorter than the common source lines 180. The common source line 180 and the dummy source line 180D may have the same width in the y direction. According to an example embodiment, the width of the dummy source line 180D may be less than that of the common source line 180.

The dummy source line 180D may be disposed at the same distance from edges of the gate stack 130 or from both common source lines 180 in the y direction.

Channel columns 160 in the gate stacks 130 between the common source lines 180 may be disposed in 8 columns in the x-direction in the cell array region CA. In another embodiment, the channel columns 160 may be disposed in a different number of columns, e.g., 12 columns, 14 columns, 16 columns, or the like, in the x-direction. The contact plugs 190 in gate stacks 130 between the common source lines 180 may be, for example, in 4 columns in the x-direction in the connection region CT.

In addition, the dummy columns 160D in the gate stacks 130 between the common source lines 180 may be, for example, in 4 columns in the x-direction in the connection region CT. The dummy columns 160D may be between the contact plugs 190 in alignment with the contact plugs 190. The dummy columns 160D may have a different arrangement in another embodiment. The dummy columns 160D may be symmetrical to each other, based on a virtual center line (or another reference line) of the gate stack 130 extending in the x-direction.

Figure 4A:
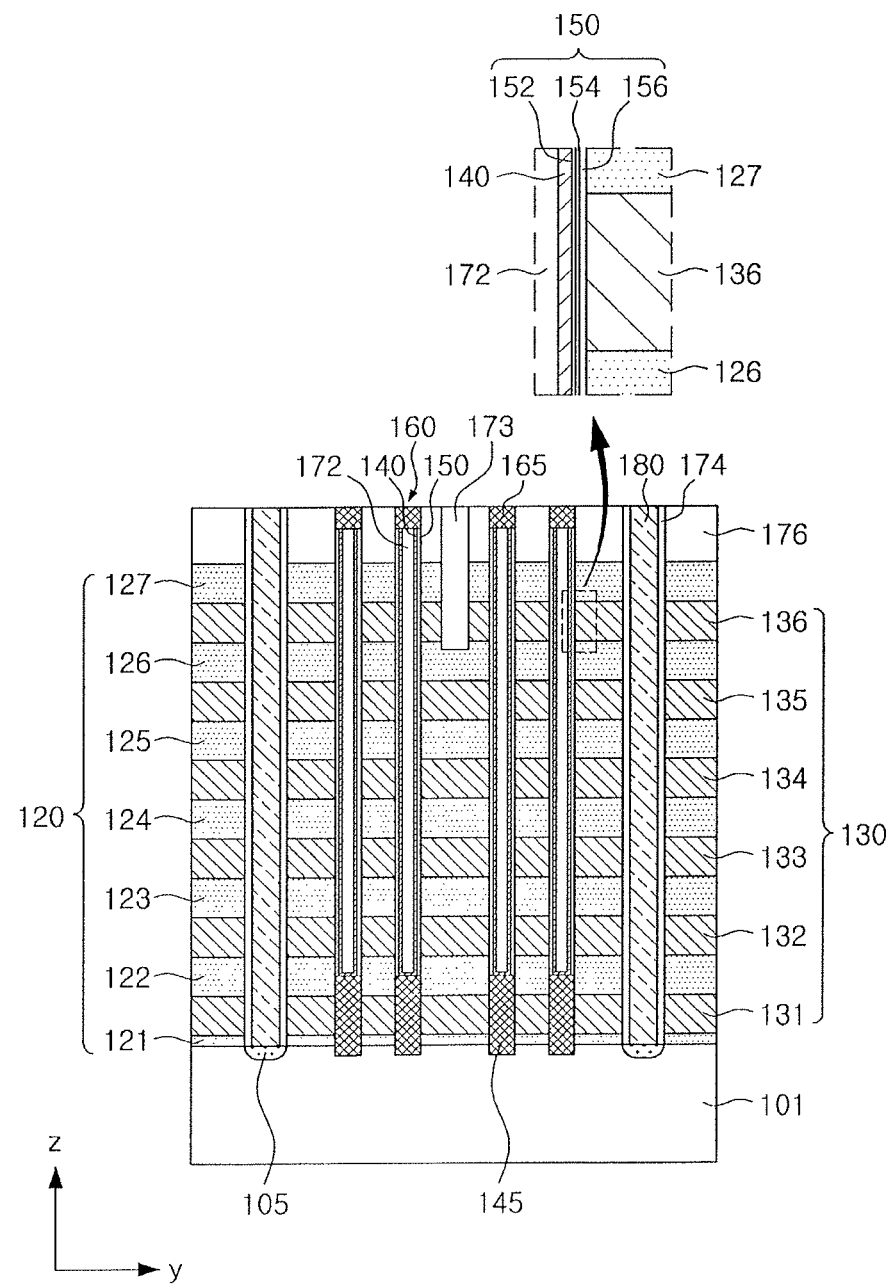
FIGS. 4A to 4D illustrate section views of the memory device in FIG. 3.

With reference to FIGS. 3 and 4A, the memory device 100 may further include a substrate 101, gate electrode layers 131 to 136 stacked to be spaced apart from each other in a third direction (e.g., z direction) on the substrate 101, to form a gate stack 130 thereon. The memory device 100 may further include a plurality of mold insulating layers 121 to 127 (mold insulating layers 120) alternately stacked with the gate electrode layers 131 to 136, and a gate dielectric layer 150. The interlayer insulating layer 176 may be on the gate stack 130.

The substrate 101 may have an upper surface extending in the x direction and the y direction. The substrate 101 may include a semiconductor material, for example, a Group IV semiconductor, a Group III-V compound semiconductor, or a Group II-VI compound semiconductor. For example, the Group IV semiconductor may include silicon, germanium, or silicon-germanium. The substrate 101 may be, for example, a bulk wafer or an epitaxial layer.

Referring again to FIG. 2, each of the gate electrode layers 131 to 136 may form gates of the ground selection transistor GST, the plurality of memory cells MC1 to MCn, and the string select transistor SST. Portions 132 to 135 of the gate electrode layers may be extended to form word lines WL1 to WLn, and may be connected in common in a predetermined unit of memory cell strings adjacent to each other in the x-direction and y direction. In example embodiments of FIGS. 3 to 4D, a total of six gate electrode layers 131 to 136 are arranged as an example. In another embodiment, the number of gate electrode layers forming the memory cells MC1 to MCn may be different depending, for example, on the memory capacity of the memory device 100. For example, the number of the gate electrode layers forming the memory cells MC1 to MCn may be 60 or more.

The gate electrode layer 131 of the ground selection transistor GST may extend in the x-direction to form a ground select line GSL. The gate electrode layer 136 of the string select transistor SST may extend in the x-direction to form a string select line SSL. For example, the gate electrode layer 136 of the string select transistor SST may be divided into a plurality of regions in memory cell strings adjacent to each other in the y direction to form different string select lines SSL.

Referring to FIG. 3, the gate electrode layer 136 of the string select transistor SST forming one gate stack 130 may be divided into a plurality of regions electrically separated from each other by a line isolation region SC. In this case, a second insulating layer 173 may be inside of the line isolation region SC, as illustrated, for example, in FIG. 4A. According to an example embodiment, the gate electrode layer 136 of the string select transistor SST may be divided in various forms in memory cell strings adjacent to each other in the y direction.

In an example embodiment, the number of the gate electrode layers 136 for the string select transistor SST and the number of the gate electrode layers 131 for the ground selection transistor GST may be two or more individually, and the structure thereof may be different from the structure of the gate electrodes 132 to 135 of the memory cells MC1 to MCn.

The gate electrode layers 131 to 136 may include polysilicon, a metal silicide material, or a metallic material. The metal silicide material may be, for example, a metal silicide material selected from cobalt (Co), nickel (Ni), hafnium (Hf), platinum (Pt), tungsten (W), and titanium (Ti). The metallic material may be a material including, for example, tungsten (W). The gate electrode layers 131 to 136 may further include a diffusion barrier. For example, the diffusion barrier may include at least one of tungsten nitride (WN), tantalum nitride (TaN), and titanium nitride (TiN).

The mold insulating layers 121 to 127 (mold insulating layers 120) may be arranged between the gate electrode layers 131 to 136. The mold insulating layers 121 to 127 may be spaced apart from each other in the z direction and may extend in the x-direction, for example, in a manner similar to the gate electrode layers 131 to 136. The respective mold insulating layers 121 to 127 may extend in the x-direction by a predetermined length, e.g., the same length as the respective gate electrode layers 131 to 136 below the respective mold insulating layers 121 to 127 to be adjacent thereto. The mold insulating layers 120 may include an insulating material, e.g., silicon oxide or silicon nitride.

The channel columns 160 may be in the cell array region CA, pass through the mold insulating layers 121 to 127 and the gate electrode layers 131 to 136, and extend in the z direction perpendicular to an upper surface of the substrate 101. A single memory cell string may be configured based on each of the channel columns 160. The channel columns 160 may be regularly spaced apart from each other in the x and y directions.

Each of the channel columns 160 in the cell array region CA may have a structure including a drain pad 165, a channel 140 below the drain pad 165, a gate dielectric layer 150 outside of the channel 140, a first insulating layer 172 inside of the channel 140, and an epitaxial layer 145 below the channel 140. The channels 140 may respectively have a columnar shape and may extend in the z direction perpendicular to an upper surface of the substrate 101.

The channels 140 may be formed in an annular shape surrounding the inner first insulating layer 172 or a macaroni shape. In other embodiments, the channels 140 may have different shape, e.g., a prismatic shape or a cylindrical shape, without the first insulating layer 172. The channels 140 are illustrated as being perpendicular to the substrate 101. In another embodiment, the channels 140 may have an included lateral surface which, for example, becomes narrower in a direction toward the substrate 101 as aspect ratio increases.

The channels 140 may be in contact with upper surfaces of the epitaxial layers 145 and may be electrically connected to the substrate 101 through the epitaxial layers 145. The channels 140 may include a semiconductor material such as polysilicon or single crystalline silicon. The semiconductor material may be an undoped material or a material including a p-type impurity or an n-type impurity.

The gate dielectric layer 150 may be between the gate electrode layers 131 to 136 and the channel 140. As illustrated in an enlarged view of FIG. 4A, the gate dielectric layer 150 may include a tunneling layer 152, a charge storage layer 154, and a blocking layer 156 sequentially stacked from the channel 140.

The tunneling layer 152 allows an electric charge to tunnel to the charge storage layer in an F-N tunneling method. The tunneling layer 152 may include, for example, a silicon oxide. The charge storage layer 154 may be provided as a charge trapping layer or a floating gate conductive layer. For example, the charge storage layer 154 may include a dielectric material, a quantum dot, or a nanocrystal. The quantum dot or the nanocrystal may be formed of a conductive material, for example, fine particles of a metal or a semiconductor. The blocking layer 156 may include a high dielectric constant (high-k) dielectric substance, e.g., one with a higher dielectric constant than a silicon oxide film. Examples of the structure of the gate dielectric layer 150 will be described with reference to FIGS. 5A and 5B.

In an upper end of the memory cell string, the drain pad 165 may cover an upper surface of the first insulating layer 172 and may be electrically connected to the channel 140. The drain pad 165 may include, for example, doped polysilicon. The drain pad 165 may serve as the drain region of the string select transistor SST (e.g., refer to FIG. 2). In addition, the drain pads may be electrically connected to bit lines BL1 to BLm (e.g., refer to FIG. 2) on upper parts thereof.

Figure 10A:
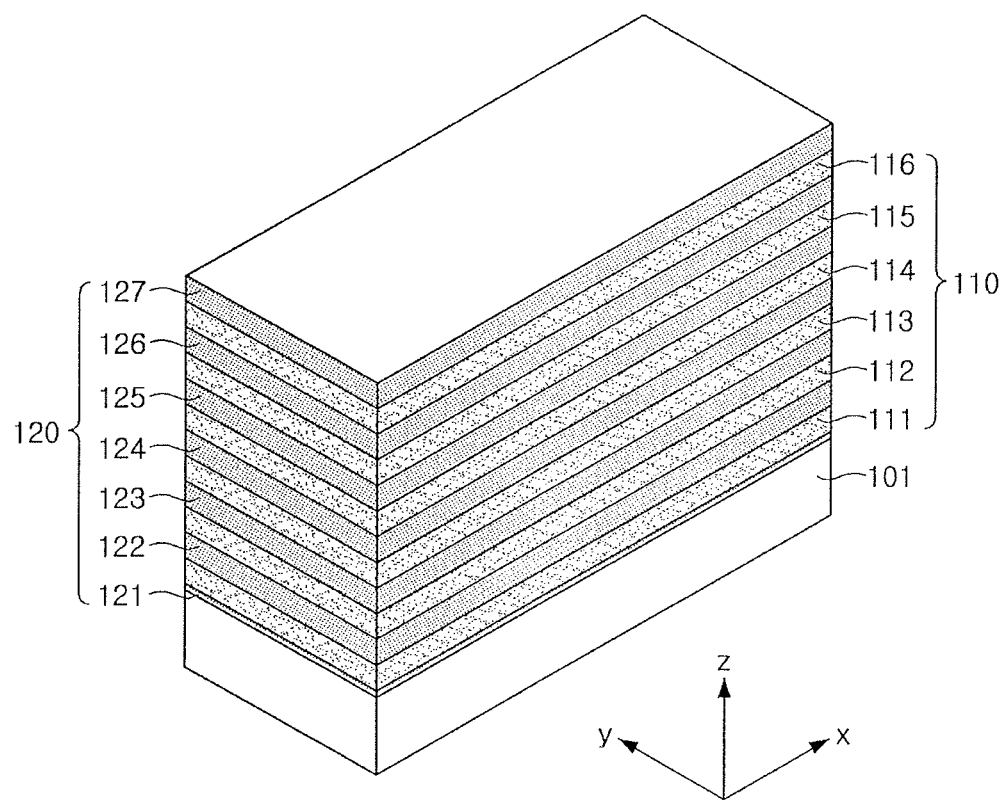
FIGS. 10A to 10G illustrate an embodiment of a method for manufacturing a memory device.
Figure 10B:
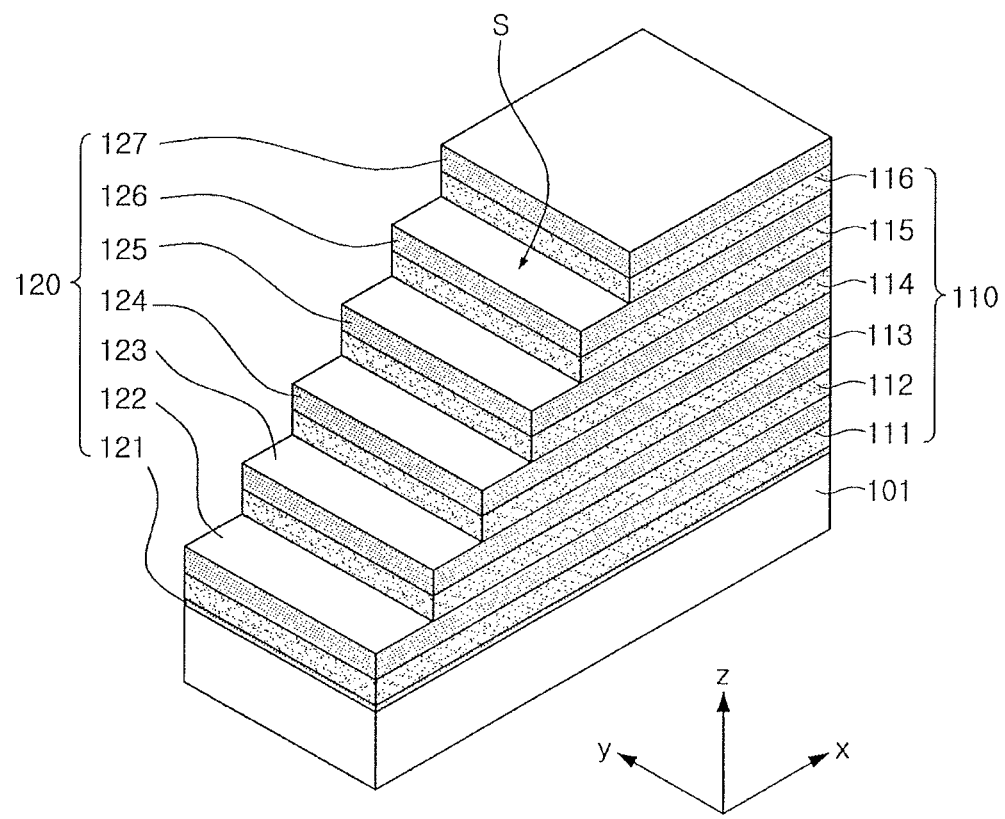
Figure 10C:
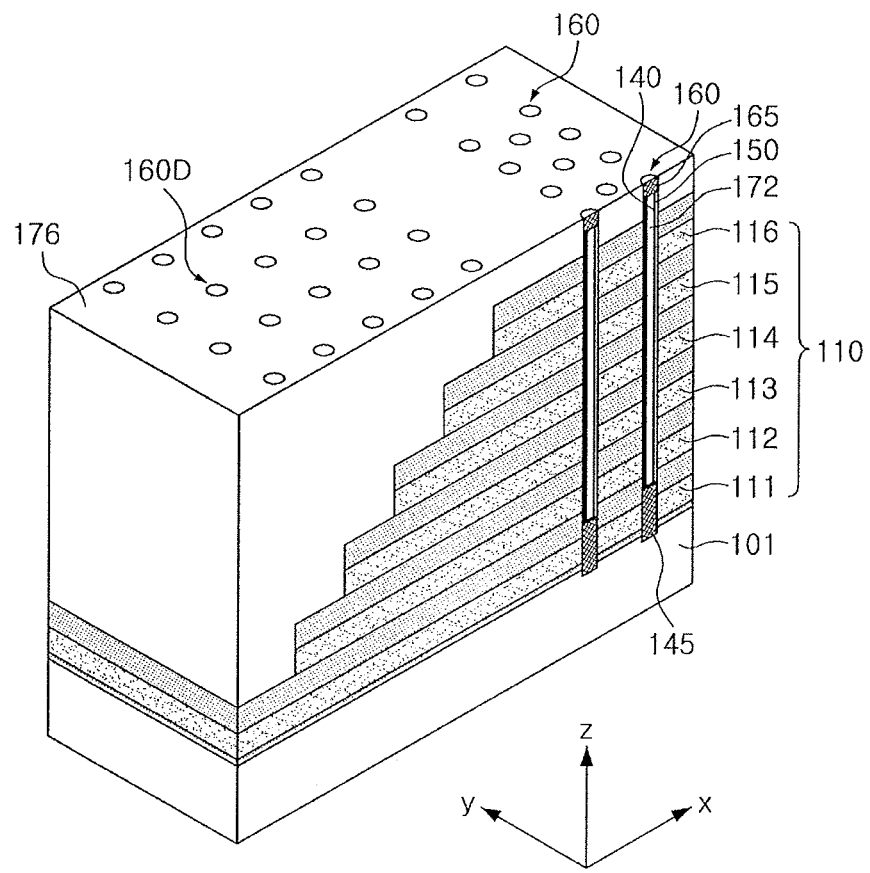
Figure 10D:
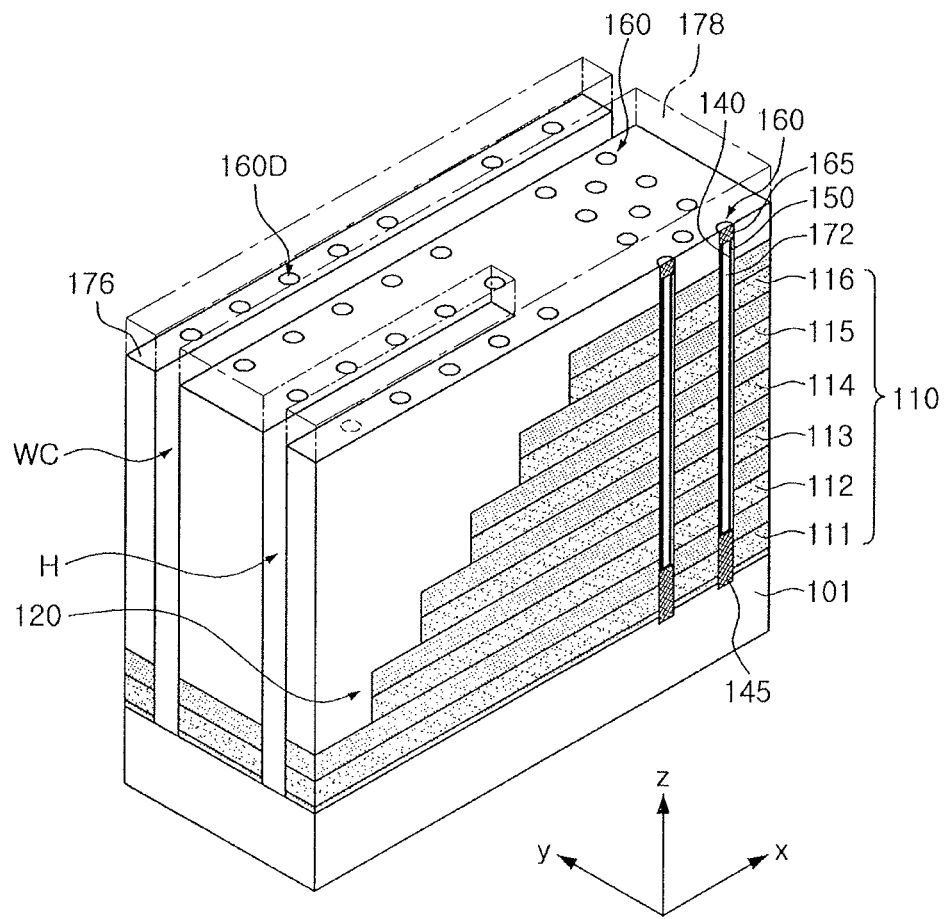
Figure 10E:
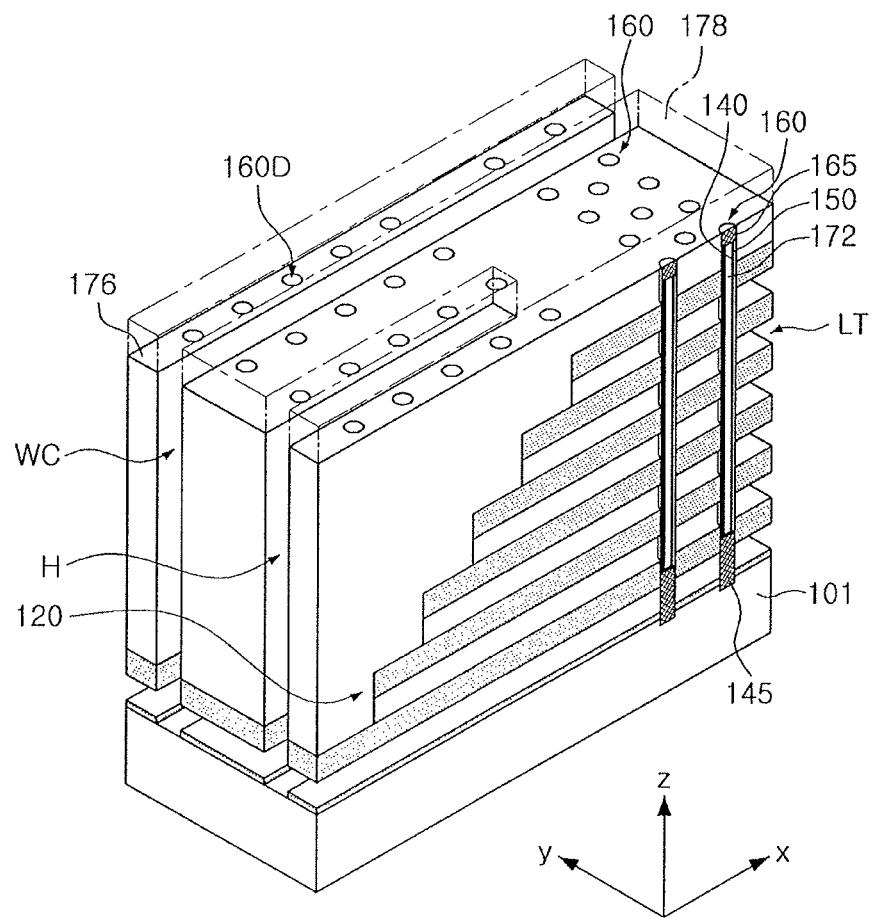

The dummy columns 160D and the dummy channel column 160S may support a mold insulating layer 120 during a process of fabricating a memory device 100 such as described, for example, with reference to FIG. 10E. The dummy columns 160D in the connection region CT may have the same structure as the channel columns 160 in the cell array region CA. The dummy channel columns 160S may be inside of the line isolation region SC and may have the same structure as the channel column 160.

Figure 4B:
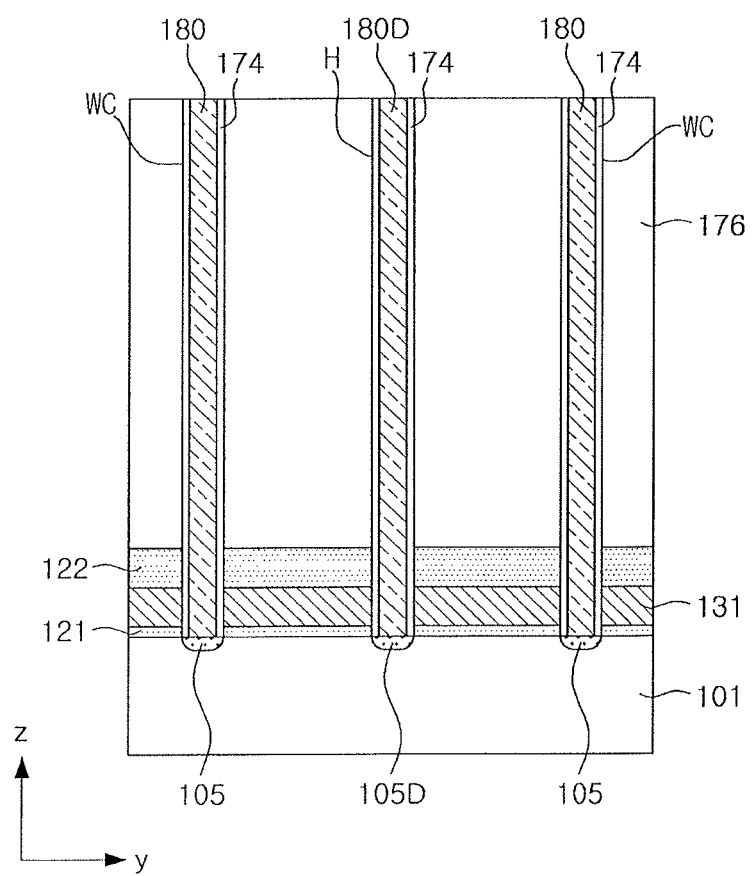
Figure 4C:
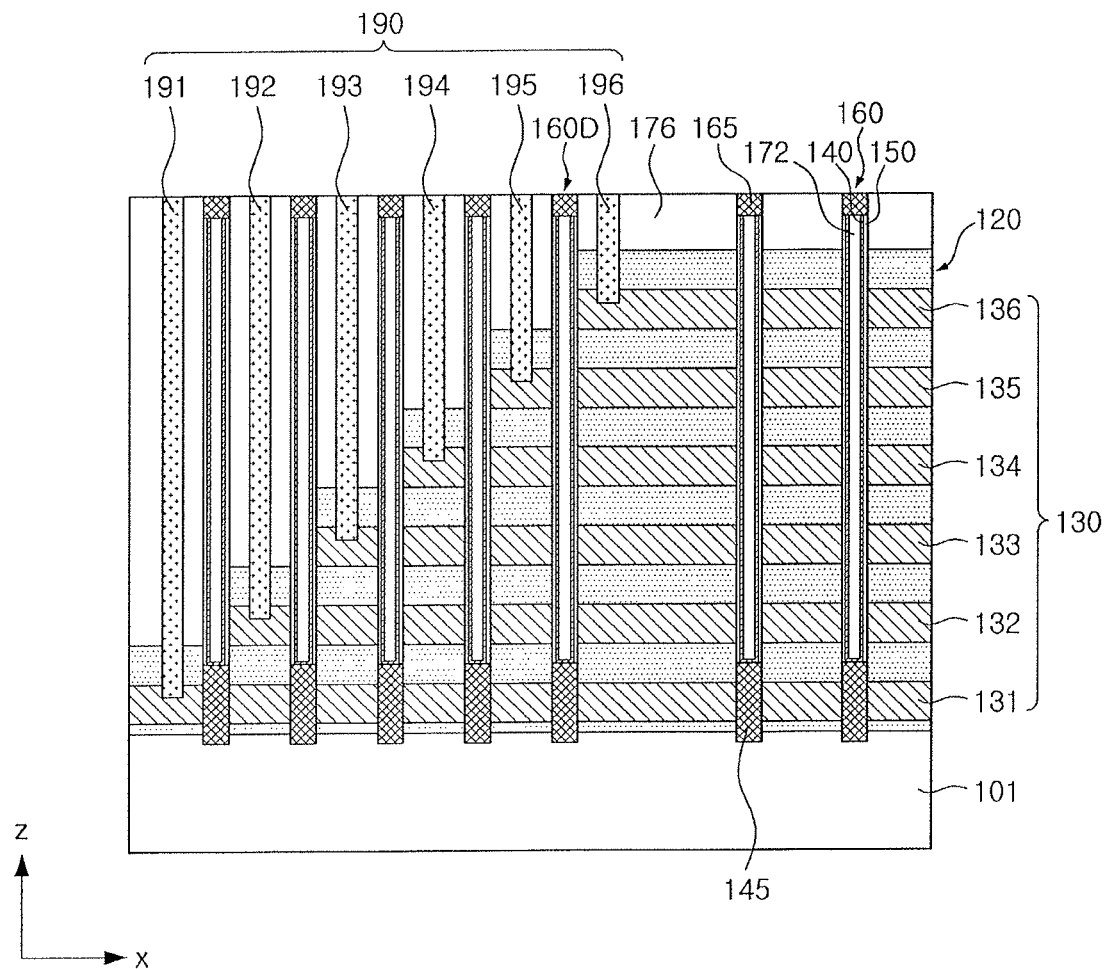
Figure 4D:
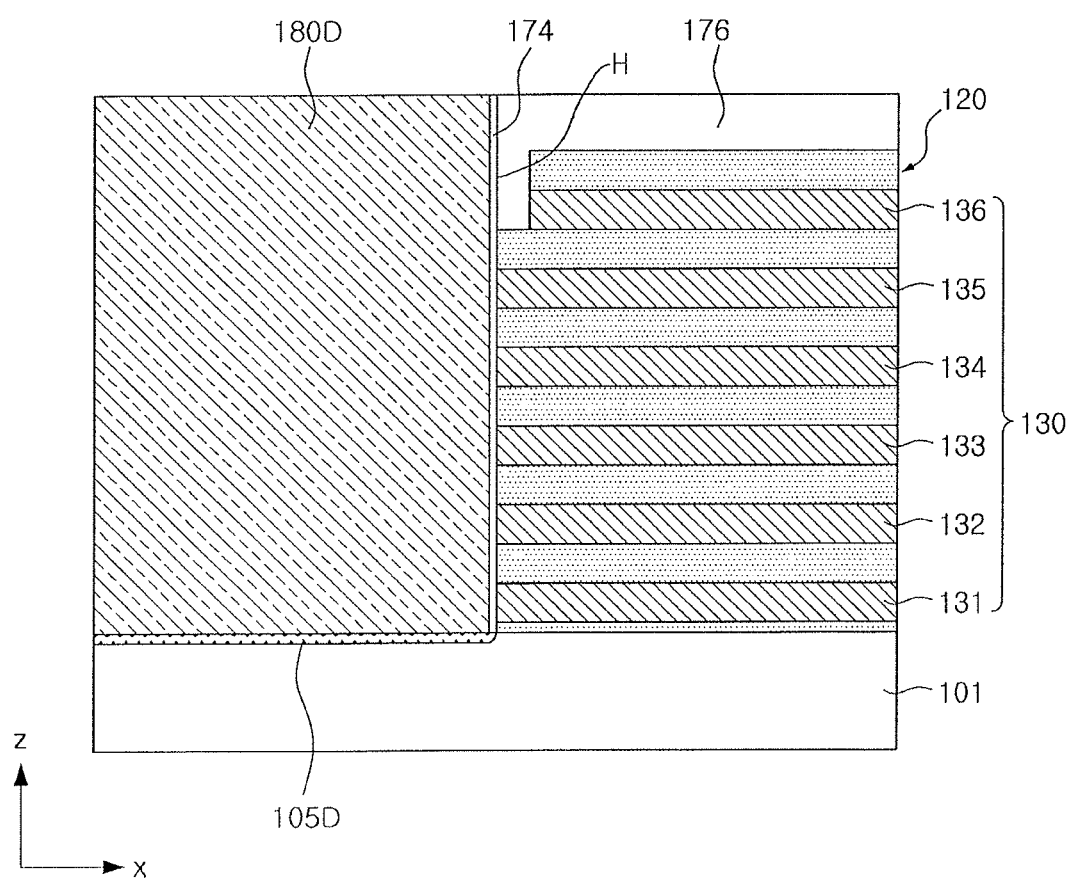

Referring to FIGS. 3, 4B, and 4D, a common source line 180 and a dummy source line 180D may upwardly extend from an upper surface of a doped region 105 and a dummy doped region 105D inside of the substrate 101, respectively. A first trench WC may be formed on doped region 105, to pass through an interlayer insulating layer 176, a gate stack 130, and a mold insulating layer 120 in the z direction. The first trench WC may extend throughout the entirety of the cell array region CA and the connection region CT in the x-direction. The common source line 180 may be formed inside the first trench WC.

A second trench H may be formed on the dummy doped region 105D, to pass through the interlayer insulating layer 176, the gate stack 130, and the mold insulating layer 120 in the z direction. The second trench H may extend in the x-direction in the connection region CT. The dummy source line 180D may be formed inside the second trench H. The length of the second trench H may be less than the length of the first trench WC in the x-direction.

The common source line 180 and the dummy source line 180D may be separated from the gate stack 130 by a third insulating layer 174. The common source line 180 and the dummy source line 180D may be on the substrate 101 and may extend higher than an uppermost gate electrode layer 136 in the z direction. Thus, in one embodiment, heights of the common source line 180 and the dummy source line 180D may be greater than the thickness of the gate stack 130.

The common source line 180 may be arranged, for example, one-by-one in the gate stack 130. The common source line 180 and the dummy source line 180D may include a conductive material, for example, tungsten (W), aluminum (Al), or copper (Cu). In the example embodiment, the dummy source line 180D may be formed in the same process as the common source line 180, and thus may have the same structure as the common source line 180. In an example embodiment, the dummy source line 180D may be formed in a different process from the common source line 180, and thus may have a structure different from the common source line 180.

The dummy source line 180D may be between the common source lines 180 and may extend in an x-direction inside the interlayer insulating layer 176 in the connection region CT. The interlayer insulating layer 176 between the common source lines 180 may be divided, into a plurality of regions inside the connection region CT, by a dummy pattern part including the dummy source line 180D between the common source lines 180 and the third insulating layer 174. The gate electrode layer 131 to 136 and the mold insulating layer 120 between the common source lines 180 inside the connection region CT may be divided into a plurality of regions by the dummy pattern part.

To increase the memory capacity of the memory device 100, the number of gate electrode layers stacked on the substrate 101 may be increased (e.g., to 60 or more) and the number of the channel columns 160 in the cell array region CA may be increased, thereby increasing the width of the gate electrode layers. Accordingly, the volume of the interlayer insulating layer 176 between the common source lines 180 in the connection region CT may be increased. For example, the volume of the interlayer insulating layer 176 may be increased to a greater extent toward an edge region of connection region CT.

Contraction of the interlayer insulating layer 176 may occur during a manufacturing process. Due to a stress caused by contraction of the interlayer insulating layer 176, delamination between the interlayer insulating layer 176 and the common source lines 180 may occur in the edge region of the connection region CT. Metal source gases may be diffused during a subsequent interconnection process through a gap generated by the delamination. These problems may cause defects in reliability and erase characteristics of a memory device.

According to the example embodiment, the interlayer insulating layer 176 is divided into a plurality of regions in the edge region of the connection region CT. This may release or reduce stress due to contraction of the interlayer insulating layer 176 during a manufacturing process. Thus, the delamination may be prevented in the edge region of the connection region CT. In addition, reliability and erase characteristics of the memory device may be improved.

Referring to FIGS. 3 and 4C, the gate stack 130 may extend by different lengths in the connection region CT to form a stepped structure. The gate electrode layers 131 to 136 stacked on the substrate 101 may surround the channel columns 160 in the cell array region CA, and may extend by different lengths in the x-direction in the connection region CT to form the stepped structure. The stepped structure may be formed, as a result of the gate electrode layers in a relatively low position among the gate electrode layers 131 to 136 extending by predetermined lengths longer than gate electrode layers in a relatively high position.

By forming such a stepped structure, a plurality of contact plugs 190 may be connected to the gate electrode layers 131 to 136, respectively. Due to the stepped structure, the contact plugs 190 may pass through the interlayer insulating layer 176 and respective mold insulating layers 120 to be connected to the gate electrode layers 131 to 136. The contact plugs 190 may include a conductive material, for example, tungsten (W). The dummy columns 160D between the contact plugs 190 may pass through the interlayer insulating layer 176, the mold insulating layer 120, and the gate electrode layer 130 and extend to the substrate 101.

Figure 5A:
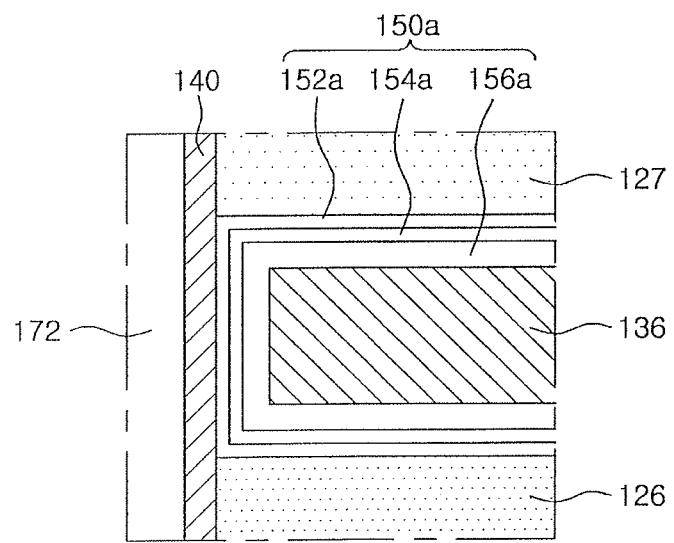
FIGS. 5A and 5B illustrate an embodiment of a gate dielectric layer.
Figure 5B:
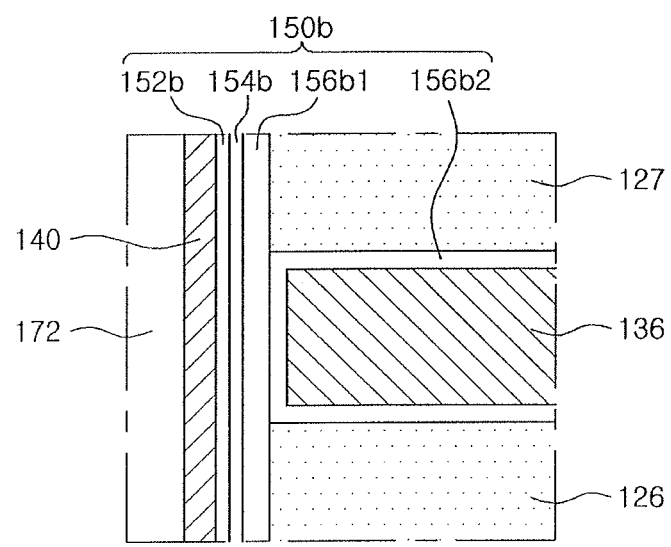

FIGS. 5A and 5B are cross-sectional views of an embodiment of a gate dielectric layer and include a region corresponding to an enlarged view of FIG. 4A.

FIG. 5A illustrates the gate electrode layer 136, the gate dielectric layer 150a, the channel 140, and the first insulating layer 172 of the memory cell strings. The gate dielectric layer 150a may have a stacked structure, in which a tunneling layer 152a, a charge storage layer 154a, and a blocking layer 156a are sequentially stacked from the channel 140. The relative thicknesses of the layers forming the gate dielectric layer 150a may vary in different embodiments.

For example, the gate dielectric layer 150a may be disposed to allow the tunneling layer 152a, the charge storage layer 154a, and the blocking layer 156a to surround the gate electrode layer 136 in a manner different from the example embodiment of FIG. 4A.

The tunneling layer 152 may include at least one of silicon oxide ($SiO_2$), silicon nitride ($Si_3N_4$), silicon oxynitride (SiON), hafnium oxide ($HfO_2$), hafnium silicon oxide ($HfSi_xO_y$), aluminum oxide ($Al_2O_3$), or zirconium oxide ($ZrO_2$).

The charge storage layer 154 may be a charge trapping layer or a floating gate conductive film.

The blocking layer 156a may include silicon oxide ($SiO_2$), silicon nitride ($Si_3N_4$), silicon oxynitride (SiON), or a high dielectric constant dielectric material. The high dielectric constant dielectric material may be one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), or praseodymium oxide ($Pr_2O_3$).

FIG. 5B illustrates a gate electrode layer 136, a gate dielectric layer 150b, a channel 140, and a first insulating layer 172 of memory cell strings. The gate dielectric layer 150b may have a stacked structure, in which a tunneling layer 152b, a charge storage layer 154b, and blocking layers 156b1 and 156b2 are sequentially stacked from the channel 140.

For example, in the case of the gate dielectric layer 150b according to the example embodiment, a blocking layer may include two layers, for example, first and second blocking layers 156b1 and 156b2, in a manner different from the example embodiments in FIGS. 4A and 5A. The first blocking layer 156b1 may extend vertically in a manner similar to the channel 140, and the second blocking layer 156b2 may surround the gate electrode layer 136. The first blocking layer 156b1 may be, for example, a relatively low dielectric constant layer compared with the second blocking layer 156b2, e.g., the second blocking layer 156b2 may be a high dielectric constant layer. In this case, the first blocking layer 156b1 may be in a lateral surface of the second blocking layer 156b2. Thus, as an energy band such as a barrier height is adjusted, characteristics of a memory device (e.g., erase characteristics) may be improved.

Figure 6:
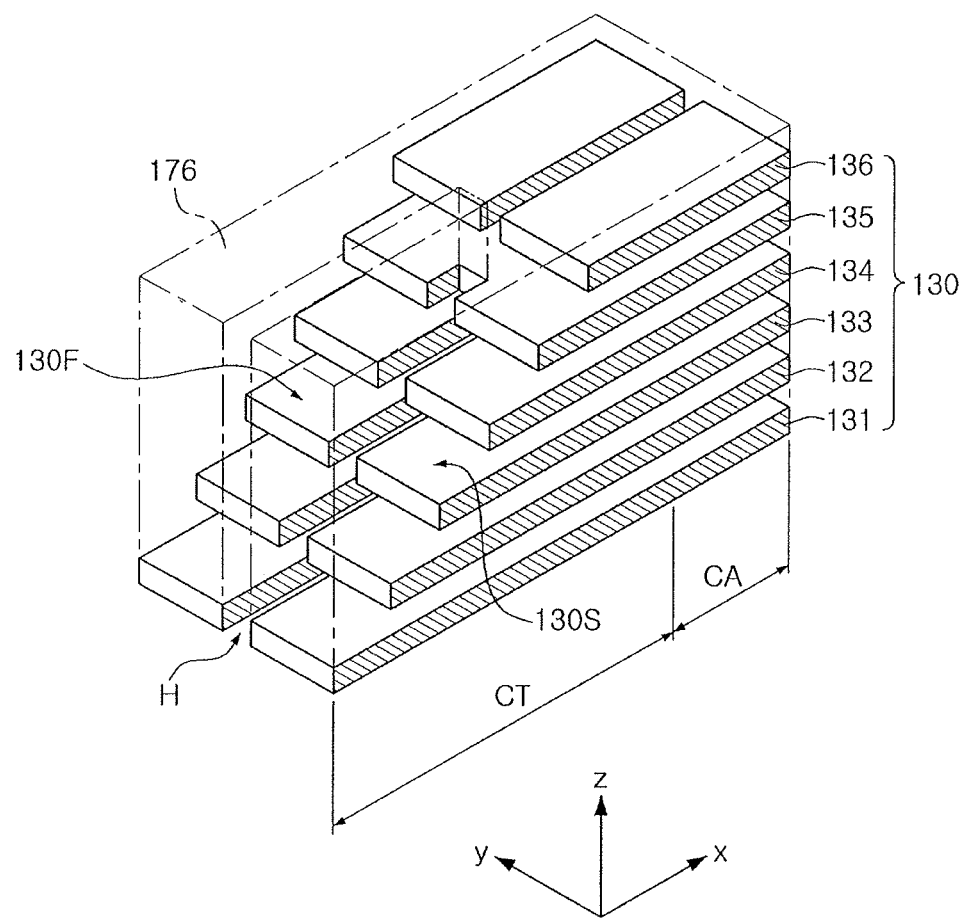
FIG. 6 illustrates an embodiment of an interlayer insulating layer and gate stack.

FIG. 6 illustrates and embodiment of an interlayer insulating layer and a gate stack. Referring to FIG. 6, gate stack 130 may include gate electrode layers 131 to 136, and the interlayer insulating layer 176 may be on the gate stack 130.

An uppermost gate electrode layer 136 may be divided into two regions spaced apart from each other in both the cell array region CA and the connection region CT. Lower gate electrode layers 131 to 135 are respectively formed as a single layer having a single region in the cell array region CA, and may be respectively separated into first and second regions 130F and 130S in the connection region CT by a second trench H. The interlayer insulating layer 176 may be divided into two regions in the connection region CT by the second trench H. As described above with reference to FIG. 3, a dummy pattern part including a dummy source line 180D may be in the second trench H.

In an example embodiment, when a length of the second trench H is formed to be shorter in the x-direction, some gate electrode layers, for example, 134 and 135, may be respectively formed in a single layer having a single region in the cell array region CA and the connection region CT.

In an example embodiment, the number of the gate electrode layers 131 to 135 including the second trench H may be optionally selected and the gate electrode layers 131 to 135 including the second trench H may be sequentially selected from a lowermost gate electrode layer 131, which extend to the greatest extent lengthwise in the connection region CT.

Figure 7:
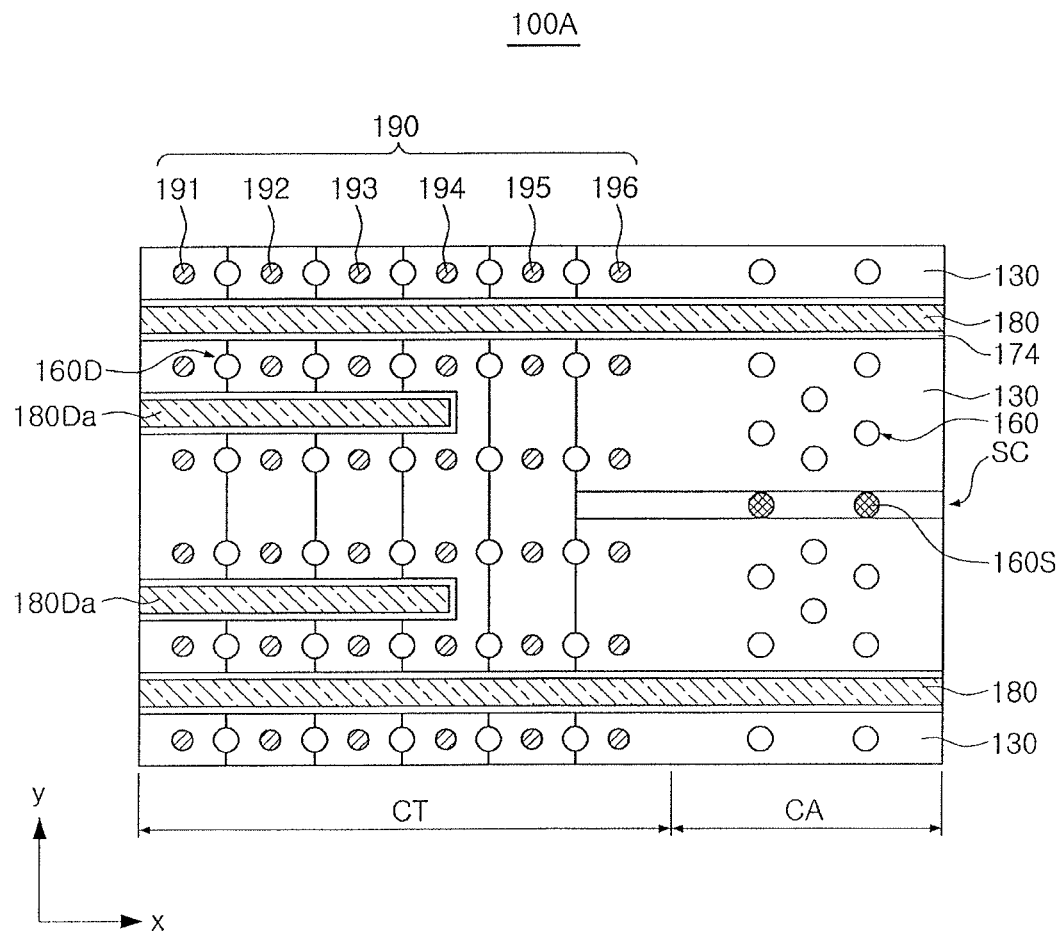
FIGS. 7 to 9 illustrate other embodiments of a memory device.
Figure 8:
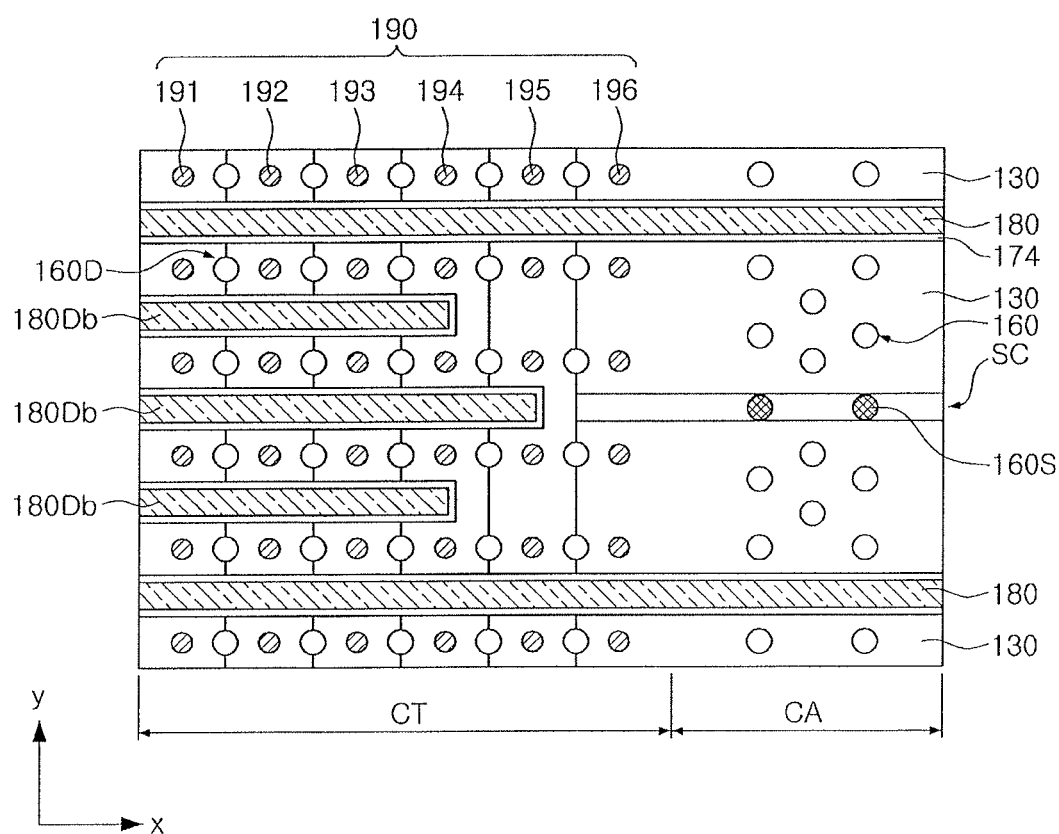
Figure 9:
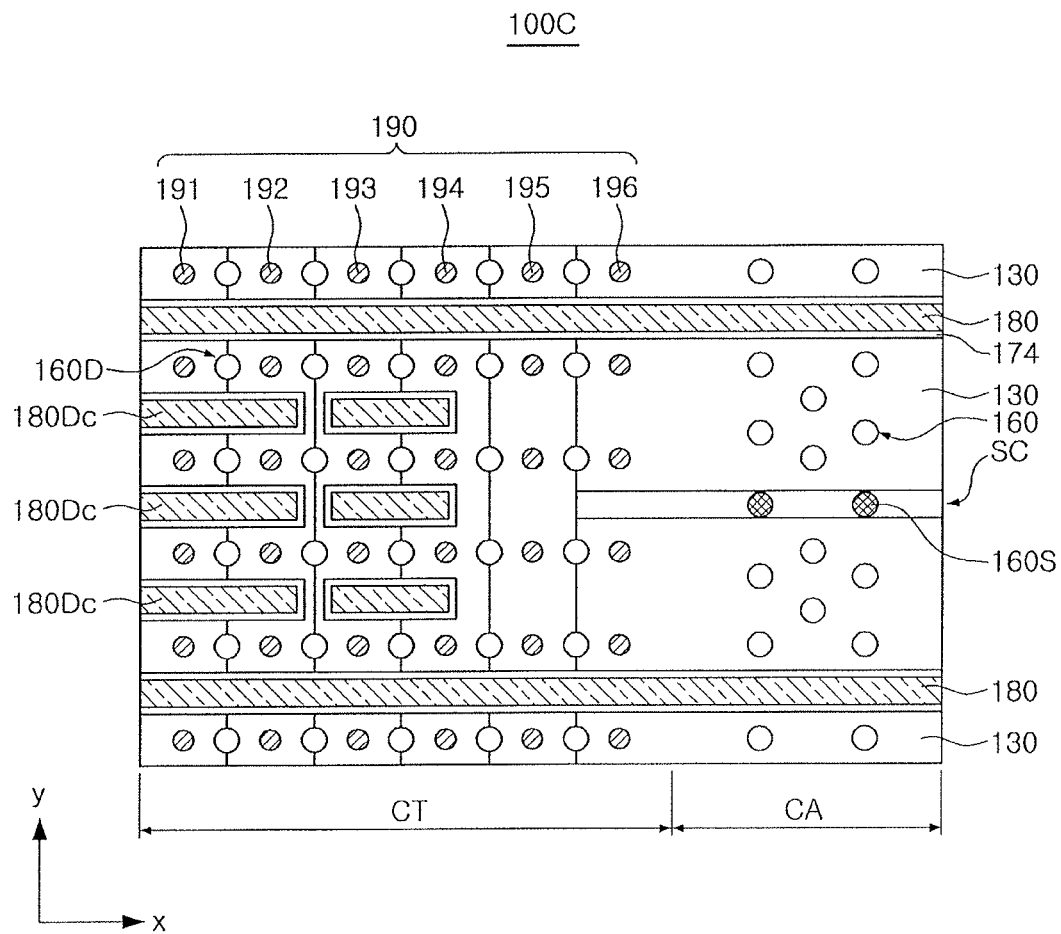

FIGS. 7 to 9 illustrate other embodiments of a memory device.

Referring to FIG. 7, memory device 100A may include gate stacks 130, channel columns 160, dummy columns 160D, dummy channel columns 160S, a common source line 180, a dummy source line 180Da, and contact plugs 191 to 196 (contact plugs 190).

In the example embodiment, the arrangement of the dummy source lines 180Da disposed in the connection region CT may be different compared with the example embodiment of FIG. 3. Except for the dummy source lines 180Da, the remaining features may be the same as the example embodiment of FIG. 3.

In the example embodiment, two dummy source lines 180Da may be between the common source lines 180. The two dummy source lines 180Da may be symmetrically disposed based on a virtual center line (or other reference line) of the gate stack 130 extending the x-direction. The dummy source lines 180Da may be respectively disposed to be closer to the common source lines 180 than each other. The dummy source lines 180Da may extend to a shorter extent than the common source lines 180.

Referring to FIG. 8, a memory device 100B may include gate stacks 130, channel columns 160, dummy columns 160D, dummy channel columns 160S, a common source line 180, a dummy source line 180Db, and contact plugs 191 to 196 (contact plugs 190). In the example embodiment, compared with the example embodiment of FIG. 3, arrangements of the dummy source lines 180Db in the connection region CT are different. Remaining features may be the same as in the example embodiment of FIG. 3, except for the dummy source lines 180Db.

In the example embodiment, three dummy source lines 180Db may be between the common source lines 180. The three dummy source lines 180Db may be symmetrically disposed based on a virtual center line (or other reference line) of the gate stack 130 extending in the x-direction. The dummy source line 180Db in the middle may be on the virtual center line of the gate stack 130 in the x-direction. The length of the dummy source line 180Db in the middle may be longer than the length of the dummy source lines 180Db on both sides.

In one embodiment, the length of the dummy source line 180Db in the middle may be shorter than the length of the dummy source lines 180Db on both sides. The lengths of three dummy source lines 180Db may be identical to each other.

Referring to FIG. 9, memory device 100C may include gate stacks 130, channel columns 160, dummy columns 160D, dummy channel columns 160S, a common source line 180, a dummy source line 180Dc, and contact plugs 191 to 196 (contact plugs 190). In the example embodiment, arrangements of the dummy source lines 180Dc in the connection region CT are different in comparison to the example embodiment of FIG. 3. Remaining features may be the same as in the example embodiment of FIG. 3, except for the dummy source lines 180Dc.

In the example embodiment, the three dummy source lines 180Dc may be between the common source lines 180. The three dummy source lines 180Dc may be symmetrically disposed based on a virtual center line (or other reference line) of the gate stack 130 extending in the x-direction. The dummy source line 180Dc in the middle may be on a virtual center line (or other reference line) of the gate stack 130 extending in the x-direction.

The dummy source lines 180Dc may have a disconnected linear shape in a direction toward the cell array region CA from an edge of the connection region CT. Disconnected lengths of the dummy source lines 180Dc may be the same as or different from each other. In one embodiment, the dummy source line 180Dc in the middle may have an integrally extended linear shape, and the dummy source lines 180Dc in both sides may have a disconnected linear shape. In one embodiment, the dummy source line 180Dc in the middle may have a disconnected linear shape, and the dummy source lines 180Dc in both sides may have an integrally extended linear shape.

Referring to FIGS. 3, 7, 8, and 9, the above described example embodiments may be combined or modified in various forms.

FIGS. 10A to 10G illustrate various stages in an embodiment of a method for fabricating a memory device, which, for example, may correspond to the example embodiment of FIGS. 3 to 4D.

With reference to FIG. 10A, sacrificial layers 111 to 116 (sacrificial layers 110) and mold insulating layers 120 may be alternately stacked on the substrate 101. In FIG. 10A, the mold insulating layers 120 and the sacrificial layers 110 may be alternately stacked on the substrate 101 from a first mold insulating layer 121 as a start.

The sacrificial layers 110 may be formed, for example, of a material which may be etched with etch selectivity with respect to the mold insulating layers 120. For example, the sacrificial layers 110 may be formed of a material which may be etched while significantly reducing etching of the mold insulating layers 120 during an operation of etching the sacrificial layers 110. In one embodiment, the mold insulating layer 120 may include at least one of a silicon oxide film or a silicon nitride film. The sacrificial layer 110 may be formed of a material different from the mold insulating layer 120 and may include, for example, a silicon film, a silicon oxide film, a silicon carbide, or a silicon nitride film.

As illustrated above, in an example embodiment, thicknesses of the mold insulating layers 120 may not be all the same. A lowermost mold insulating layer 121 of the mold insulating layers 120 may be formed to be relatively thin, and an uppermost mold insulating layer 127 may be formed to be relatively thick. However, thicknesses of the mold insulating layers 140 and the sacrificial layers 110 may be different in another embodiments. The number of films forming the mold insulating layers 140 and the sacrificial layers 110 may be different in other embodiments.

With reference to FIG. 10B, the sacrificial layers 110 and the mold insulating layers 120 alternately stacked on the substrate 101 are etched to prepare a connection region having a stepped structure S. Respective stepped layers of the stepped structure S may provide pad regions connected to contact plugs.

In order to form the stepped structure S, a predetermined mask layer is formed on a stack of the sacrificial layers 110 and the mold insulating layers 120 provided on the substrate 101. The sacrificial layer 110 and the mold insulating layers 120 exposed by the mask layer may be etched. The mask layer may be trimmed to form units having a predetermined size, and a process of etching portions of the sacrificial layers 110 and the mold insulating layers 120 exposed by the mask layer may be repeatedly performed to form the stepped structure S.

In the example embodiment, one sacrificial layer 110 and one mold insulating layer 120 form a pair, which may extend the same length in the x-direction. However, the lowermost mold insulating layer 121 may extend by the same length as the lowermost sacrificial layer 111.

Referring to FIG. 10C, after an interlayer insulating layer 176 covering the sacrificial layers 110 and the mold insulating layers 120 is formed, the channel columns 160 and the dummy columns 160D passing through the sacrificial layers 110 and the mold insulating layers 120 may be formed.

First, the interlayer insulating layer 176 may be formed to cover the stepped structure S. Next, openings in the form of a hole passing through the sacrificial layers 110 and the mold insulating layers 120 may be formed. The openings may extend to the substrate 101 in the z direction. The openings may be formed, for example, by anisotropic etching of the sacrificial layers 110 and the mold insulating layers 120.

As a stacked structure including two different kinds of films is etched, a side wall of the openings may not be perpendicular to an upper surface of the substrate 101. For example, the width of the openings may be reduced toward an upper surface of the substrate 101. The openings may be over-etched, and thus a recess region may be formed at a predetermined depth in the upper surface of the substrate 101.

The epitaxial layer 145 may be formed to have a predetermined height on the substrate 101 below the openings using selective epitaxial growth (SEG). An upper surface level of the epitaxial layer 145 may be higher than an upper surface level of a lowermost gate electrode layer 131.

Next, a gate dielectric layer 150 may be formed and a channel 140 may be formed inside the openings.

Next, a first insulating layer 172 filling the openings and a drain pad 165 provided on the first insulating layer 172 may be formed.

In the stepped structure S of the sacrificial layers 110 and the mold insulating layers 120, the dummy columns 160D may be formed to pass through the stepped structure S. The dummy columns 160D are formed using the same process as the channel columns including a channel 140, a tunneling layer 152, a charge storage layer 154, and a drain pad 165, and thus have the same structure as the channel columns.

In an example embodiment, the second insulating layer 173 in FIG. 4A or a structure corresponding thereto may be formed in the process of FIG. 10C.

Referring to FIG. 10D, in the cell array region CA (e.g., refer to FIG. 3) in which channel columns 160 are disposed and in the connection region CT (e.g., refer to FIG. 3) in which dummy columns 160D are disposed, a first trench WC may be formed to divide a mold stack including the sacrificial layers 110 and the mold insulating layers 120 and the interlayer insulating layer 176 into a plurality of regions spaced apart from each other by a predetermined interval in the y direction. In addition, in the connection region CT, a second trench H may be formed to partially divide the mold stack and the interlayer insulating layer 176, divided by the first trench WC, into a plurality of regions separated from each other in the y direction.

Before the first trench WC and the second trench H are formed, an upper insulating layer 178 is additionally formed on the interlayer insulating layer 176 and the drain pad 165, to thereby prevent the drain pad 165, the channel 140 below the drain pad 165, and the like, from being damaged.

The first trench WC may allow the substrate 101 to be exposed between the channel columns 160 and the dummy columns 160D. The second trench H may allow the substrate 101 to be exposed between the dummy columns 160D. The first trench WC may be, for example, a linear trench extending in the x-direction. A plurality of mold stacks separated from each other may be defined as a result.

Sacrificial layers 110 of the mold stacks are replaced with gate electrode layers by a subsequent process, to thereby form a plurality of gate stacks. The second trench H extending in the x-direction may be formed together with the first trench WC in the connection region CT (e.g., refer to FIG. 3) inside one mold stack defined by the first trench WC. The second trench H may be formed together with the first trench WC through a single etching process. The second trench H may have, for example, a linear form extending in the same direction as the first trench WC. The length extending in the x-direction of the second trench H may be shorter than that of the first trench WC. The common source line 180 (e.g., refer to FIG. 3) and the dummy source line 180D may be respectively formed, in a subsequent process, on the substrate 101 exposed by the first trench WC and the second trench H.

The first trench WC and the second trench H may be formed by forming a mask layer using a photolithographic process and by anisotropic etching a stack of the sacrificial layers 110 and the mold insulating layers 120.

Referring to FIG. 10E, the sacrificial layers 110 exposed through the first trench WC and the second trench H may be removed by an etching process, to thereby form a plurality of side openings LT between the mold insulating layers 120. A portion of side walls of the channel columns 160 may be exposed through the side openings LT.

In this process, since the dummy columns 160D are formed at a predetermined interval in the pad region provided by the stepped structure, the mold insulating layer 120 may be stably supported thereby, so as not to be bent after the sacrificial layers 110 are removed.

Figure 10F:
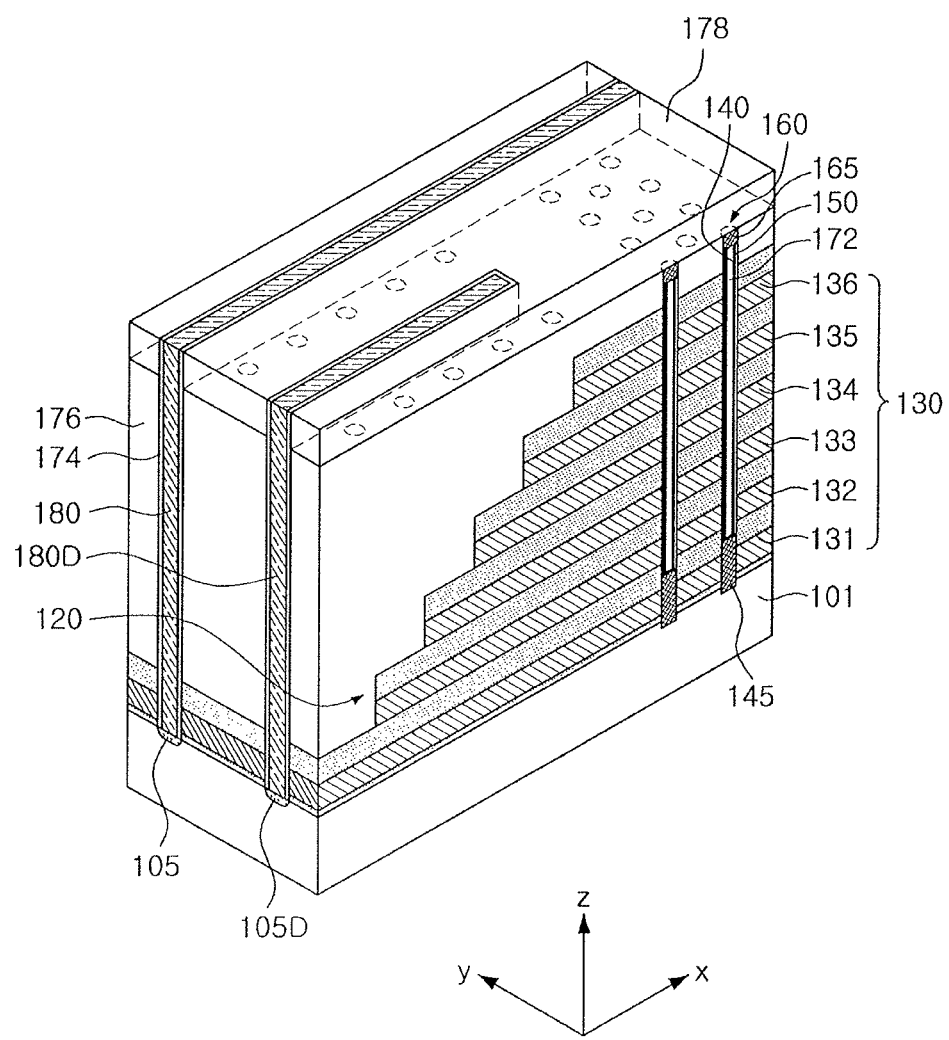

Referring to FIG. 10F, the gate electrode layers 131 to 136 may be formed inside the side openings LT. The common source line 180 and the dummy source line 180D may be formed inside the first trench WC and the second trench H, respectively.

The gate electrode layers 131 to 136 may include polysilicon, a metal silicide material, or a metallic material. The metal silicide material may be, for example, a silicide material of a metal, e.g., cobalt (Co), nickel (Ni), hafnium (Hf), platinum (Pt), tungsten (W), or titanium (Ti). The metallic material may include, for example, tungsten (W). The gate electrode layers 131 to 136 may further include a diffusion barrier, which, for example, may include at least one of tungsten nitride (WN), tantalum nitride (TaN), or titanium nitride (TiN).

To form the gate electrode layers 131 to 136 only inside the side openings LT, a material forming the gate electrode layers 131 to 136 in the first trench WC and the second trench H may be removed through an additional process. However, such a process may be performed in a subsequent process.

Next, an impurity is injected into the substrate 101 exposed by the first trench WC and the second trench H, and thus a doped region 105 may be formed.

Next, a third insulating layer 174 is formed on side walls of the first trench WC and the second trench H, and the common source line 180 and the dummy source line 180D may be formed, respectively. The common source line 180 and the dummy source line 180D may be formed at the same time in the process, and thus may include the same material. The common source line 180 and the dummy source line 180D may include a conductive material, for example, may include tungsten (W), aluminum (Al), or copper (Cu). The common source line 180 and the dummy source line 180D may be disposed on the substrate 101, and may extend upwardly beyond an upper level of an uppermost gate electrode layer 136.

In an example embodiment, doped region 105 may also be formed after the third insulating layer 174 is formed and may be formed to include a high concentration region and low concentration doped regions in both ends of the high concentration region.

Figure 10G:
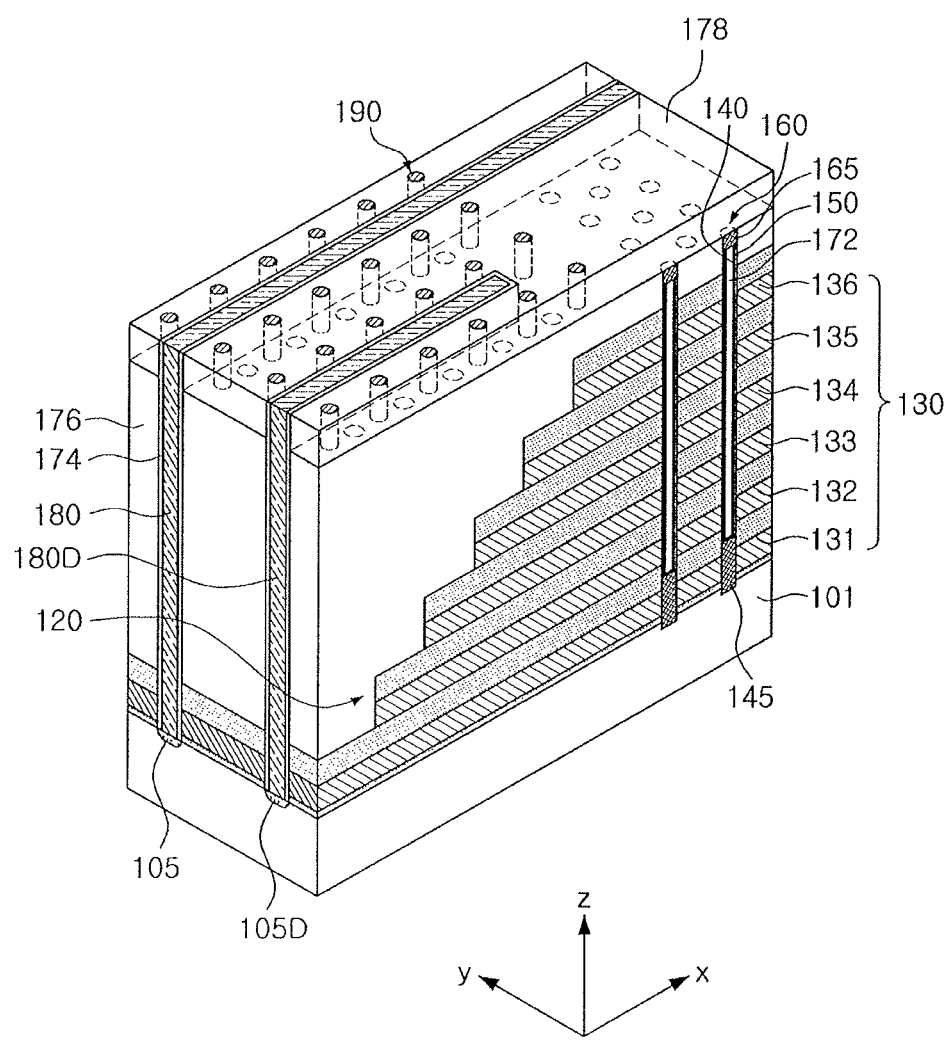

Referring to FIG. 10G, contact plugs 190 connected to the gate electrode layers 131 to 136, respectively, may be formed in the pad region.

After openings connected to the gate electrode layers 131 to 136 are formed in advance, by etching the interlayer insulating layer 176 and the upper insulating layer 178, a conductive material is deposited to form the contact plugs 190. The openings may also be formed by etching at least a portion of the gate electrode layers 131 to 136.

Figure 11:
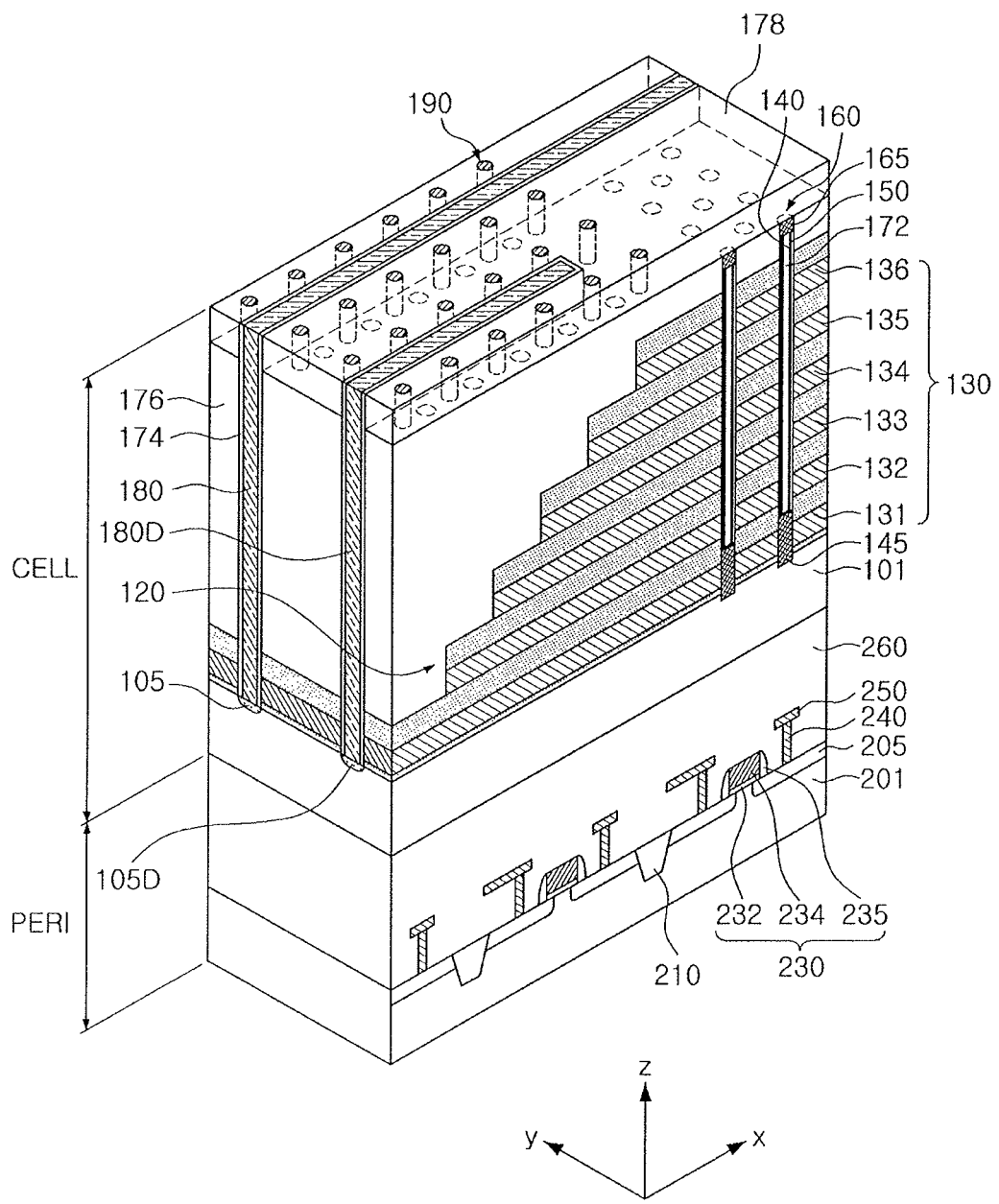
FIG. 11 illustrates another embodiment of a memory device.

FIG. 11 illustrates another embodiment of a memory device which may include a cell region CELL and a peripheral circuit region PERI that are vertically disposed. The cell region CELL may correspond to a region in which the memory cell array 20 in FIG. 1 is disposed. The peripheral circuit region PERI may correspond to a region in which the driving circuit 30, or the like, in FIG. 1 is disposed. The cell region CELL may be on the peripheral circuit region PERI. In an example embodiment, the cell region CELL may also be below the peripheral circuit region PERI.

The cell region CELL may have the same structure as in FIG. 10G. Thus, the descriptions with reference to FIG. 10G may be applied to the cell region CELL. However, the substrate 101 may be the same size or smaller than as a base substrate 201. The substrate 101 may be formed, for example, of polycrystalline silicon or may be single-crystallized after being formed of amorphous silicon. The cell region CELL may have a different structure in another embodiment.

The peripheral circuit region PERI may include a base substrate 201, circuit devices 230 on the base substrate 201, contact plugs 240, and wire lines 250. The base substrate 201 may have an upper surface extending in the x and y directions. The base substrate 201 may include a device isolation layer 210 defining an active region. A doped region 205 including an impurity may be in a portion of the active region. The base substrate 201 may include a semiconductor material, for example, a Group IV semiconductor, a Group III-V compound semiconductor, or a Group II-VI compound semiconductor.

The circuit device 230 may include a planar transistor. Each circuit device 230 may include a circuit gate insulating layer 232, a spacer layer 234, and a circuit gate electrode 235. The doped region 205, inside of the base substrate 201 in both sides of the circuit gate electrode 235, may serve as a source region or a drain region of the circuit device 230. The transistor of the circuit device 230 may be different from a planar transistor in another embodiment.

A peripheral region insulating layer 260 may cover the circuit devices 230 on the base substrate 201.

The contact plugs 240 may be connected to the doped regions 205. An electrical signal may be applied to the circuit device 230 by the contact plugs 240. The contact plugs may be connected to the circuit gate electrode 235 in a predetermined region. The interconnect lines 250 may be connected to the contact plugs 240 and may include a plurality of layers.

The cell region CELL and the peripheral circuit region PERI may be connected to each other in a predetermined region. For example, one end of the gate electrode 130 in the x-direction may be electrically connected to the circuit device 230.

Figure 12A:
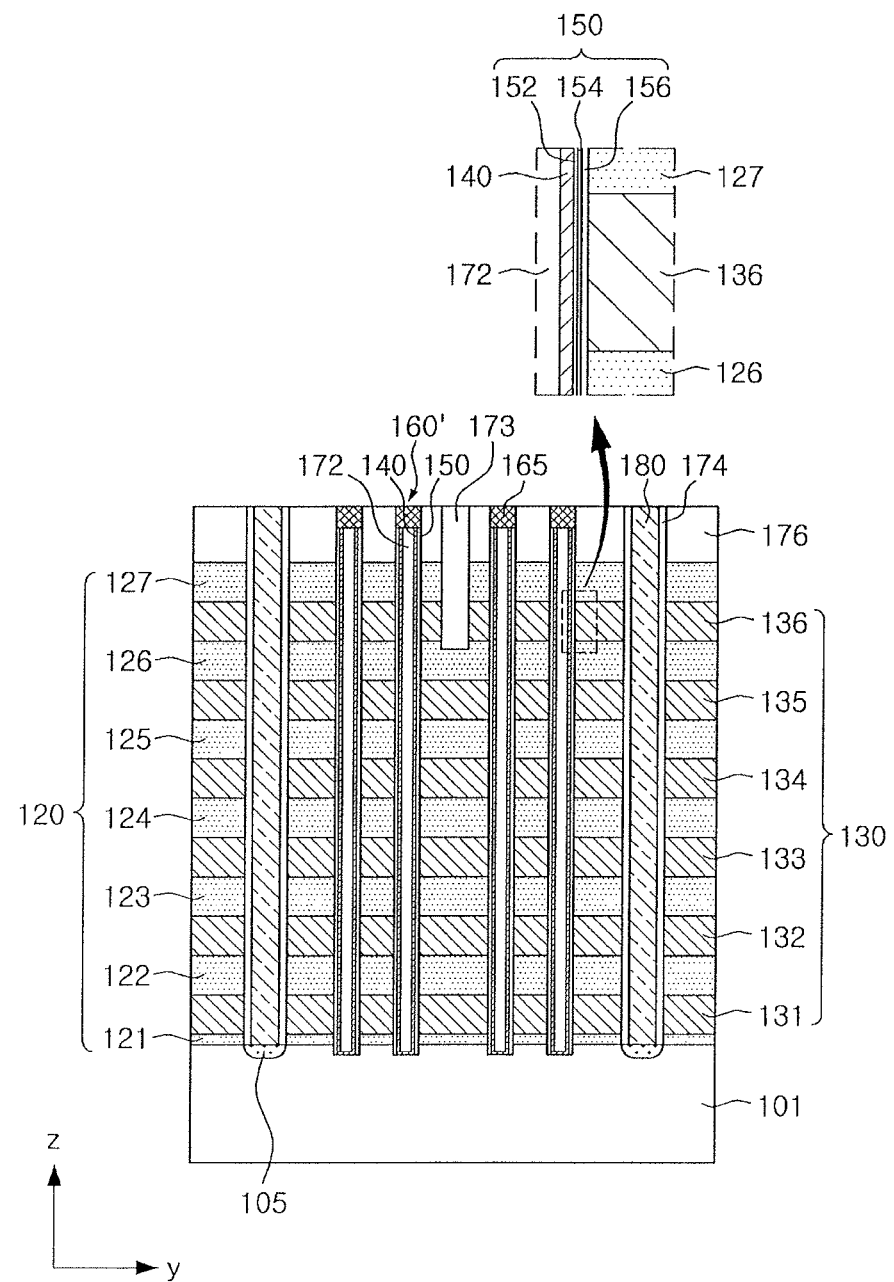
FIGS. 12A and 12B illustrate another embodiment of a memory device.

FIG. 12A illustrates a cross-sectional view of another embodiment of a memory device, which, for example, corresponds to FIG. 4A, except that the structure in FIG. 12A has channel columns 160' different from that of FIG. 4A.

Figure 12B:
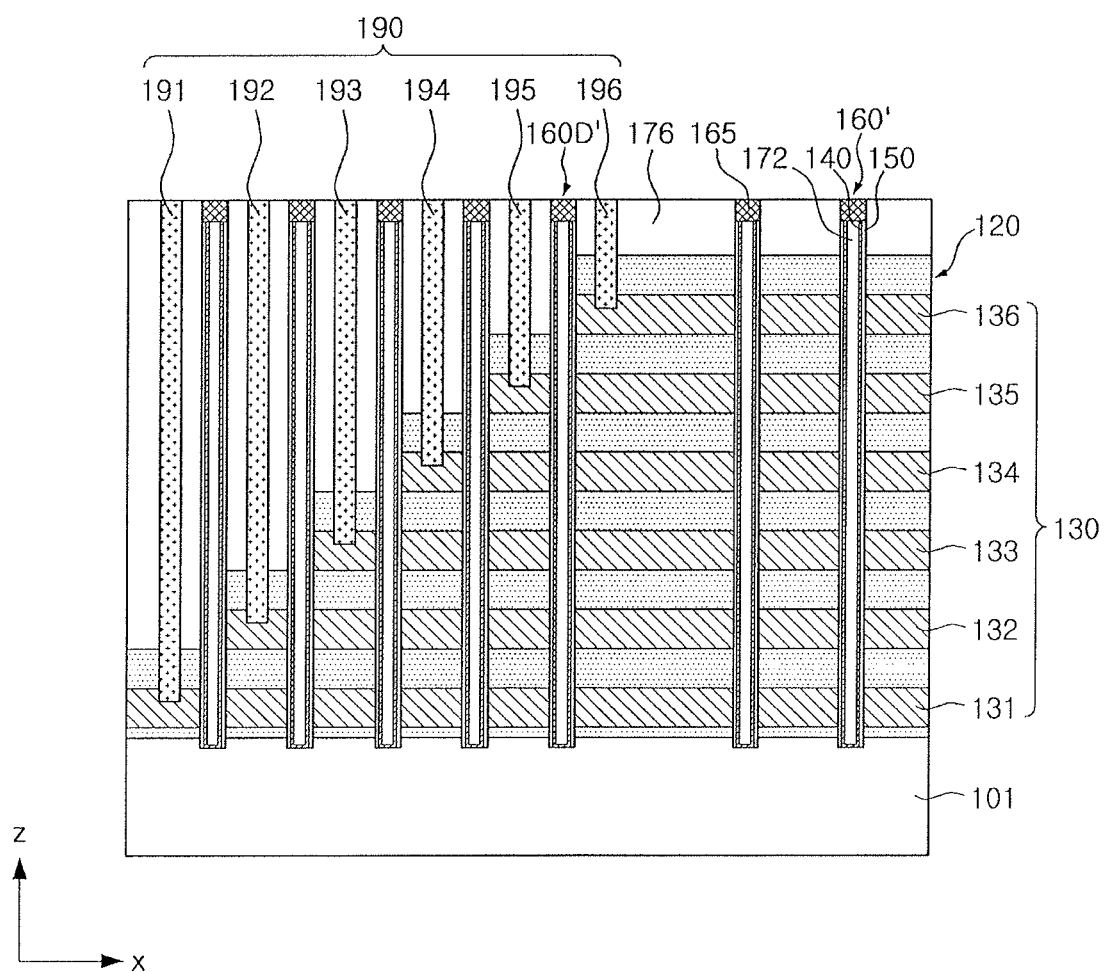

Referring to FIGS. 12A and 12B, the memory device may further include a substrate 101, gate electrode layers 131 to 136 stacked to be spaced apart from each other in a z direction on the substrate 101 to form the gate stack 130, a plurality of mold insulating layers 121 to 127 (mold insulating layers 120) stacked alternately with the gate electrode layers 131 to 136, and a gate dielectric layer 150. An interlayer insulating layer 176 may be on the gate stack 130.

The channel columns 160' may be in the cell array region CA (e.g., refer to FIG. 3), may pass through the mold insulating layers 121 to 127 and the gate electrode layers 131 to 136, and may extend in the z direction perpendicular to an upper surface of the substrate 101. One memory cell string may be based on each of the channel columns 160'. The channel columns 160' may be regularly spaced apart from each other in the x and y directions.

Each of the channel columns 160' may have a structure including a drain pad 165, a channel 140 below the drain pad 165, a gate dielectric layer 150 on an outer side of the channel 140, and a first insulating layer 172 on an inner side of the channel 140. In the example embodiment, different from the structure in FIG. 4A, the epitaxial layer below the channel 140 may not be formed. Thus, the channels 140 may be directly in contact with the substrate 101 and electrically connected to the substrate. The channels 140 may include a semiconductor material (e.g., polysilicon or single crystalline silicon), and the semiconductor material may be a undoped material or a material including a p-type or n-type impurity.

A plurality of dummy columns 160D' may be in the connection region CT (e.g., refer to FIG. 3) and may have the same structure as the channel columns 160'. In other words, an epitaxial layer may not be formed below the channels 140, and the channels 140 may be in direct contact with the substrate 101 and electrically connected thereto.

Figure 13:
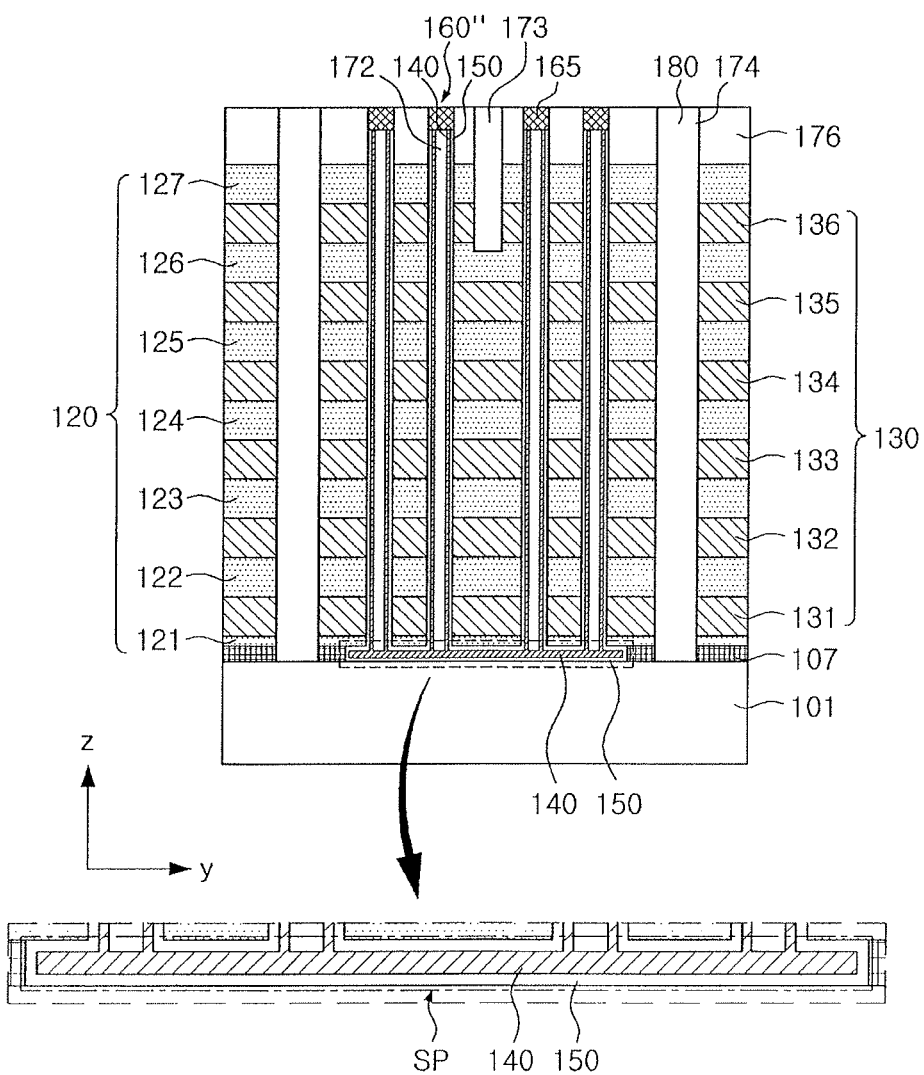
FIG. 13 illustrates another embodiment of a memory device.

FIG. 13 illustrates a cross-sectional view of another embodiment of a memory device, which, for example, corresponds to FIG. 4A.

Referring to FIG. 13, the memory device may further include a substrate 101, gate electrode layers 131 to 136 stacked to be spaced apart from each other in a z direction on the substrate 101 to form a gate stack 130, a plurality of mold insulating layers 121 to 127 stacked alternately with the gate electrode layers 131 to 136, and a gate dielectric layer 150. An interlayer insulating layer 176 may be on the gate stack 130. The gate stacks 130 may be divided into a plurality of regions in the y direction by the third insulating layer 174.

A plurality of channel columns 160" may be in the cell array region CA (e.g., refer to FIG. 3) and may extend in the z direction perpendicular to an upper surface of the substrate 101 and may pass through the mold insulating layers 121 to 127 and the gate electrode layers 131 to 136. The channel columns 160" may be regularly spaced apart from each other in the x and y directions. Each channel column 160" may have a structure including a drain pad 165, a channel 140 below the drain pad 165, a gate dielectric layer 150 on an outer side of the channel 140, and a first insulating layer 172 on an inner side of the channel 140.

In one example embodiment, the memory device may further include a horizontal portion SP below a lowermost mold insulating layer 121 and a horizontal filling layer 107 outside of the horizontal portion SP.

The horizontal portion SP may be connected to the channel columns 160" and may be on the substrate 101 in parallel with an upper surface of the substrate 101. The horizontal portion SP may have a structure which includes a plate between and connected to at least two or more channel columns CH. The number of channel columns 160" connected by the horizontal portion SP may be different in different embodiments. In an example embodiment, the horizontal portion SP may be inside of the substrate 101.

The horizontal portion SP may be formed of a channel 140 and a gate dielectric layer 150. For example, the horizontal portion SP may be formed, as the channel 140 and the gate dielectric layer 150 extend in a horizontal direction from the channel columns 160". The gate dielectric layer 150 may be on a lower surface and a lateral surface of the horizontal portion SP. An inside of the horizontal portion SP may be filled with the channel 140. The arrangement of the channel region 140 and the gate dielectric layer 150 inside the horizontal portion SP may be different in other embodiments.

The horizontal filling layer 107 may be disposed horizontally to the horizontal portion SP outside of the horizontal portion SP. For example, the horizontal filling layer 107 and the horizontal portion SP may form one layer parallel with an upper surface of the substrate 101. The horizontal filling layer 107 may include a conductive material, for example, a semiconductor material. In an example embodiment, the horizontal filling layer 107 may be omitted. In this case, the horizontal portion SP may extend to a region including the horizontal filling layer 107.

In the example embodiment, a portion of the channel columns 160" may be connected to a bit line in an upper part thereof. A portion of the channel columns 160" may be connected to a interconnect line (for example, a common source line) which is to receive an electrical signal different from a signal applied to the bit line.

Figure 14:
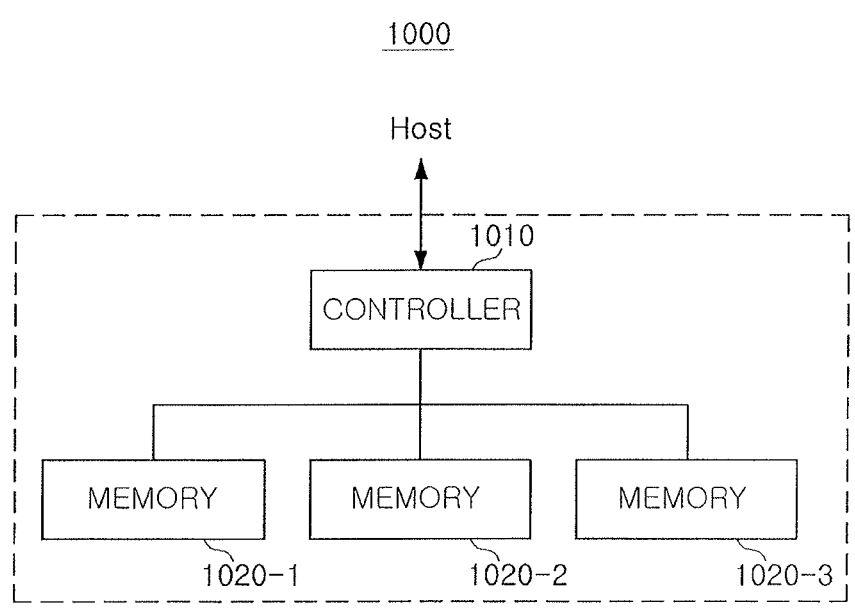
FIG. 14 illustrates an embodiment of a storage device.

FIG. 14 illustrates an embodiment of a storage device 1000 which may include a controller 1010 for communicating with a host and memories 1020-1, 1020-2, and 1020-3 for storing data. Each of the memories 1020-1, 1020-2, or 1020-3 may include a memory device in accordance with any of the aforementioned embodiments.

The host for communicating with the controller 1010 may be provided as various electronic devices in which the storage device 1000 is mounted. For example, the host may be a smartphone, a digital camera, a desktop computer, a laptop computer, a media player, or the like. The controller 1010 may store data on the memories 1020-1, 1020-2, and 1020-3 or generate a command CMD for fetching data from the memories 1020-1, 1020-2, and 1020-3 by receiving a data writing or reading request transmitted from the host.

As illustrated in FIG. 14, one or more memories 1020-1, 1020-2, and 1020-3 may be connected to the controller 1010 in parallel to each other inside the storage device 1000. Because a plurality of memories 1020-1, 1020-2, and 1020-3 are connected to the controller 1010 in parallel, the storage device 1000 having a large capacity and thus, for example, a solid state drive (SSD) may be implemented.

Figure 15:
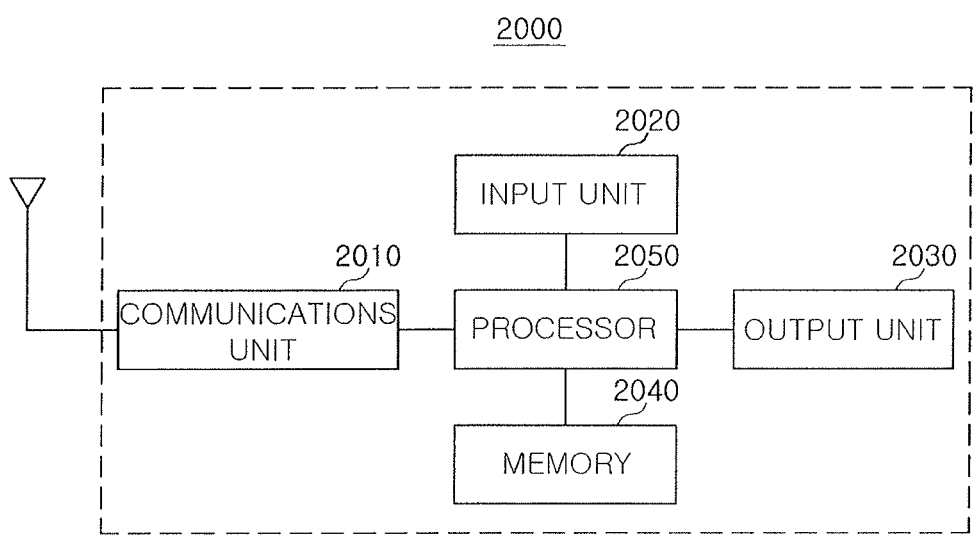
FIG. 15 illustrates an embodiment of an electronic device.

FIG. 15 illustrates an embodiment of an electronic device 2000 which may include a communications unit 2010, an input unit 2020, an output unit 2030, a memory 2040, and a processor 2050. The communications unit 2010 may include, for example, a wired/wireless communications module, and may include a wireless Internet module, a local area communications module, a GPS module, a module communications module, and the like. The wired/wireless communications module in the communications unit 2010 may be connected to an external communications network to transmit and receive data by various communications standards.

The input unit 2020 is a module provided to allow a user to control operations of the electronic device 2000, and, for example, may include a mechanical switch, a touchscreen, a voice recognition module, and the like. In addition, the input unit 2020 may include a mouse operated in a manner of a track ball, a laser pointer or the like, or a finger mouse device, and may further include various sensor modules to allow a user to input data therewith.

The output unit 2030 may output information processed by the electronic device 2000 in the form of audio or video, and the memory 2040 may store a program for processing and controlling the processor 2050, or data, or the like therein. The memory 2040 may include one or more memory devices according to any of the aforementioned embodiments. The processor 2050 may transmit a command to the memory 2040 according to required operations in order to store or retrieve data.

The memory 2040 may be embedded in the electronic device 2000 or may communicate with the processor 2050 through a separate interface. When the memory communicates with the processor 2050 through the separate interface, the processor 2050 may store or fetch data in or from the memory 2040 through various interface standards such as SD, SDHC, SDXC, MICRO SD, USB, and the like.

The processor 2050 may control operations of respective portions included in the electronic device 2000. The processor 2050 may perform controlling and processing related to voice calls, video calls, data communications, and the like, or may perform controlling and processing to multimedia playback and management. In addition, the processor 2050 may process input transmitted through the input unit 2020 by a user, and may output a result thereof through the output unit 2030. In addition, as described above, the processor 2050 may store data for controlling operations of the electronic device 2000 in the memory 2040 or may fetch required data required from the memory 2040.

Figure 16:
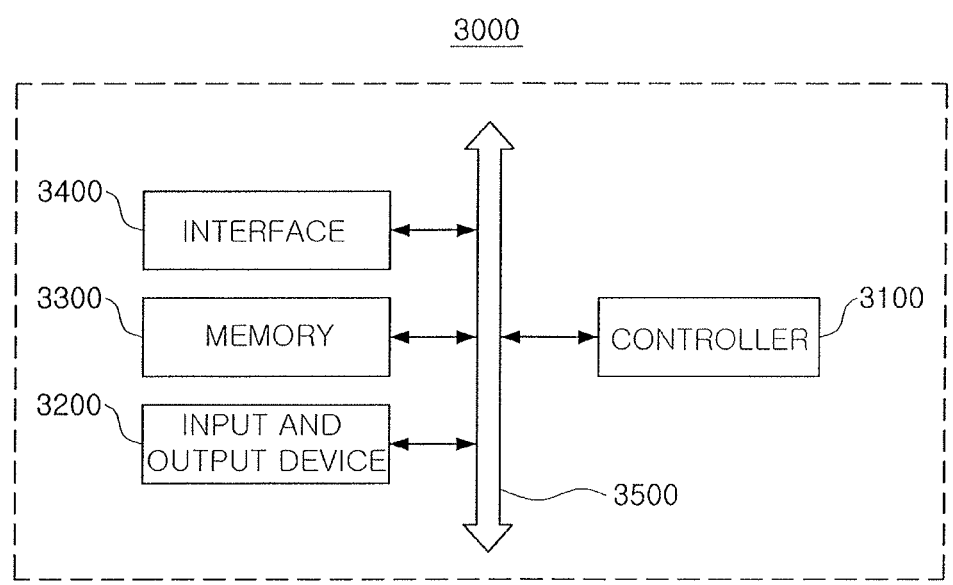
FIG. 16 illustrates an embodiment of an electronic system.

FIG. 16 illustrates an embodiment of an electronic system 200 which includes a memory device according to any of the aforementioned embodiments.

Referring to FIG. 16, the electronic system 3000 may include a controller 3100, an input/output device 3200, a memory 3300, and an interface 3400. The electronic system 3000 may be, for example, a mobile system or a system transmitting or receiving information. The mobile system may be, for example, a PDA, a portable computer, a web tablet, a wireless phone, a mobile phone, a digital music player or a memory card.

The controller 3100 may serve to execute a program and control the electronic system 3000. The controller 3100 may be, for example, a microprocessor, a digital signal processor, a microcontroller, or a device similar thereto.

The input/output device 3200 may be used to input or output data of the electronic system 3000. The electronic system 3000 may be connected to an external device, for example, a personal computer or a network using the input/output device 3200, to exchange data with the external device. The input/output device 3200 may be, for example, a keypad, a keyboard, or a display device.

The memory 3300 may store a code and/or data for operations of the controller 3100 therein, or may store data processed in the controller 3100. The memory 3300 may include a memory device in accordance with any of the aforementioned embodiments.

The interface 3400 may be a data transmission path between the electronic system 3000 and other external device. The controller 3100, the input/output device 3200, the memory 3300, and the interface 3400 may communicate with each other through a bus 3500.

At least one of the controller 3100 and the memory 3300 may include one or more memory devices as described above.

In accordance with one or more of the aforementioned embodiments, a memory device includes a dummy pattern part dividing an interlayer insulating layer into a plurality of regions in a connection region. This may prevent delamination at an interface of the interlayer insulating layer and signal lines (e.g., common source lines) during a manufacturing process and thus may prevent an erase defect and improve reliability Example embodiments have been disclosed herein, and although specific terms are employed, they are used and are to be interpreted in a generic and descriptive sense only and not for purpose of limitation. The embodiments may be combined to form additional embodiments. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments set forth in the claims.

What is claimed is:

1. A memory device comprising:
a stack structure including mold insulating layers and gate electrode layers alternately stacked on a substrate, the stack structure extending from a cell array region of the substrate to a connection region of the substrate;
an interlayer insulating layer on the stack structure;
a plurality of channel columns penetrating through the stack structure in the cell array region;
a plurality of dummy columns penetrating through the stack structure in the connection region;
a plurality of contact plugs connected to the gate electrode layers in the connection region;
a plurality of trenches penetrating through the stack structure and the interlayer insulating layer, the plurality of trenches including a plurality of first trenches and at least two second trenches;
an isolation region penetrating through an upper gate electrode layer among the plurality of gate electrodes layers;
a first insulating layer in each of the plurality of first trenches; and
a second insulating layer in each of the at least two second trenches,
wherein the plurality of first trenches extends from the cell array region to the connection region,
wherein the at least two second trenches are between the plurality of first trenches in the connection region,
wherein the first insulating layer is in contact with the upper gate electrode layer,
wherein an entirety of the second insulating layer is spaced apart from the upper gate electrode layer,
wherein the at least two second trenches include a first line portion and a second line portion,
wherein the first line portion and the second line portion extend in a first direction parallel to an upper surface of the substrate and are spaced apart from each other in a second direction perpendicular to the first direction, and
wherein an imaginary line extending from the isolation region in the first direction is between the first line portion and the second line portion, in a top view.

2. The memory device of claim 1, wherein each of the at least two second trenches has a side wall facing a side wall of the upper gate electrode layer.

3. The memory device of claim 1, wherein the gate electrode layers include word lines,
wherein the upper gate electrode layer is divided into a first select line and a second select line electrically separated from each other by the isolation region,
wherein the first select line, the second select line and the isolation region are at a higher level than an uppermost word line among the word lines,
wherein the plurality of channel columns extends in a vertical direction perpendicular to an upper surface of the substrate, and
wherein the first select line and the second select line extend in the first direction.

4. The memory device of claim 3, wherein a width in the second direction of each of the word lines is greater than a width in the second direction of each of the first and second select lines.

5. The memory device of claim 1, further comprising:
a first conductive layer in each of the plurality of first trenches; and
a second conductive layer in each of the at least two second trenches,
wherein the first insulating layer is between the first conductive layer and the stack structure,
wherein the second insulating layer is between the second conductive layer and the stack structure, and
wherein the isolation region is formed of an insulating material.

6. The memory device of claim 1, wherein a width of the at least one second trench is greater than a width of the isolation region.

7. The memory device of claim 1, wherein the channel column includes a channel layer, a dielectric structure, an insulating pillar and a pad,
wherein the channel layer is between the dielectric structure and the insulating pillar,
wherein the dielectric structure is between the channel layer and the stack structure,
wherein the dielectric structure includes a first layer, a storage layer and a second layer,
wherein the storage layer is between the first layer and the second layer,
wherein the first layer is between the storage layer and the stack structure, and
wherein the second layer is between the storage layer and the channel layer,
wherein the pad is on the insulating pillar and contacts the channel layer.

8. The memory device of claim 1, further comprising:
a base;
a circuit device on the base; and
a peripheral region insulating layer covering the circuit device,
wherein the substrate is on the peripheral region insulating layer.

9. The memory device of claim 1, wherein the at least two second trenches further include a third line portion between the first line portion and the second line portion.

10. The memory device of claim 9, wherein the third line portion has an end portion facing an end portion of the isolation region, in a top view, the third line portion and the isolation region being aligned in the top view.

11. A memory device comprising:
a stack structure including a plurality of gate electrode layers extending from a cell array region of a substrate to a connection region of the substrate, the stack structure having a stepped structure in the connection region of the substrate;
an interlayer insulating layer on the stack structure;
a plurality of trenches penetrating through the stack structure and the interlayer insulating layer, the plurality of trenches including first trenches and at least two second trenches between the first trenches;
a first insulating layer in each of the first trenches; and
a second insulating layer in each of the at least two second trenches,
wherein the first trenches extend from the cell array region to the connection region,
wherein the at least two second trenches are between the first trenches in the connection region,
wherein the first insulating layer is in contact with an upper gate electrode layer among the plurality of gate electrode layers, and
wherein an entirety of the second insulating layer is spaced apart from the upper gate electrode layer.

12. The memory device of claim 11, further comprising:
a first conductive layer in each of the plurality of first trenches; and
a second conductive layer in each of the at least two second trenches,
wherein the first insulating layer is between the first conductive layer and the stack structure, and
wherein the second insulating layer is between the second conductive layer and the stack structure.

13. The memory device of claim 11, further comprising an isolation region penetrating through an upper gate electrode layer among the plurality of gate electrode layers, the isolation region being between the first trenches.

14. The memory device of claim 11, wherein:
the at least two trenches include a first line portion and a second line portion,
the first line portion and the second line portion extend in a first direction parallel to an upper surface of the substrate and are spaced apart from each other in a second direction perpendicular to the first direction, and
an imaginary line extending from the isolation region in the first direction is between the first and second line portions of the at least two second trenches, in a top view.

15. The memory device of claim 14, wherein the at least two second trenches further include a third line portion between the first line portion and the second line portion.

16. A memory device comprising:
a stack structure including a plurality of gate electrode layers extending from a cell array region of a substrate to a connection region of the substrate, the stack structure having a stepped structure in the connection region of the substrate;
an interlayer insulating layer on the stack structure;
a plurality of trenches penetrating through the stack structure and the interlayer insulating layer, the plurality of trenches including first trenches and at least two second trenches between the first trenches; and
an isolation region,
wherein the first trenches extend from the cell array region to the connection region,
wherein the at least two second trenches include a first line portion and a second line portion in the connection region, the at least two second trenches being only in the connection region among the cell array region and the connection region of the substrate,
wherein the stack structure includes word lines and select lines on the word lines,
wherein the isolation region is between the select lines,
wherein the isolation region is on the word lines, and
wherein the first line portion and the second line portion of the at least two second trenches are spaced apart from the isolation region.

17. The memory device of claim 16, wherein:
the plurality of channel columns extend in a vertical direction perpendicular to an upper surface of the substrate,
each of the select lines extends in a first direction parallel to the upper surface of the substrate,
the select lines and the isolation region are at a higher level than an uppermost word line among the word lines, and
a width of each of the word lines is greater than a width of each of the select lines.

18. The memory device of claim 16, further comprising:
a first insulating layer and a first conductive layer in each of the plurality of first trenches; and
a second insulating layer and a second conductive layer in each of the at least two second trenches,
wherein the first insulating layer is between the first conductive layer and the stack structure,
wherein the second insulating layer is between the second conductive layer and the stack structure.

19. The memory device of claim 16, wherein:
the first line portion and the second line portion extend in a first direction parallel to an upper surface of the substrate and are spaced apart from each other in a second direction perpendicular to the first direction, and
an imaginary line extending from the isolation region in the first direction is between the first line portion and the second line portion of the at least two trenches, in a top view.

20. The memory device of claim 19, wherein the at least two second trenches further include a third line portion between the first line portion and the second line portion.

* * * * *